US012287280B2

(12) United States Patent
Parker et al.

(10) Patent No.: US 12,287,280 B2
(45) Date of Patent: Apr. 29, 2025

(54) PHOTOACOUSTIC GAS SENSORS WITH IMPROVED SIGNAL-TO-NOISE RATIO

(71) Applicant: InvenSense, Inc., San Jose, CA (US)

(72) Inventors: Jeremy Parker, Chelmsford, MA (US); Nishit Goel, San Jose, CA (US); Stephen Bart, West Newton, MA (US)

(73) Assignee: InvenSense, Inc., San Jose, CA (US)

( * ) Notice: Subject to any disclaimer, the term of this patent is extended or adjusted under 35 U.S.C. 154(b) by 169 days.

(21) Appl. No.: 17/890,016

(22) Filed: Aug. 17, 2022

(65) Prior Publication Data

US 2024/0060875 A1 Feb. 22, 2024

(51) Int. Cl.
*G01N 21/17* (2006.01)
*B81B 7/02* (2006.01)

(52) U.S. Cl.
CPC .......... *G01N 21/1702* (2013.01); *B81B 7/02* (2013.01); *B81B 2203/0127* (2013.01); *G01N 2021/1704* (2013.01); *G01N 2201/1218* (2013.01)

(58) Field of Classification Search
CPC ....... G01N 21/1702; G01N 2021/1704; G01N 2201/1218; B81B 7/02; B81B 2203/0127
See application file for complete search history.

(56) References Cited

U.S. PATENT DOCUMENTS 6,006,585 A 12/1999 Forster
8,695,402 B2* 4/2014 Thorson ............. G01N 21/1702
73/24.02

2006/0192966 A1* 8/2006 Moeckli ............. G01N 21/1702
356/437
2012/0213400 A1* 8/2012 Kasai .................... H04R 19/04
381/369
2012/0247183 A1* 10/2012 Rezachek .......... G01N 21/1702
73/24.02

(Continued)

FOREIGN PATENT DOCUMENTS

CN 108226050 A 6/2018
CN 111707619 A 9/2020

(Continued)

OTHER PUBLICATIONS

ISR for application PCT/US2023/029675, accessed from patentscope.wipo.com.*

(Continued)

*Primary Examiner* — David Z Huang
*Assistant Examiner* — Jean F Morello
(74) *Attorney, Agent, or Firm* — Van Hoven PC; Joshua Van Hoven; Stefan D. Osterbur

(57) ABSTRACT

A bi-directional photoacoustic gas sensor includes a first photoacoustic cell, where an electromagnetic radiation source emits radiation to interact with an external gas and generate pressure waves that are detected by a MEMS diaphragm. A second photoacoustic cell has an interior volume and acoustic compliance that corresponds to the interior volume and acoustic compliance of the first photoacoustic cell. Processing circuitry within a substrate uses a first acoustic signal, received by the first photoacoustic cell, and a second acoustic signal, received by the second photoacoustic cell, to determine a bi-directional response of the gas sensor to remove noise and improve the sensor's signal-to-noise ratio.

21 Claims, 11 Drawing Sheets

(56) References Cited

U.S. PATENT DOCUMENTS

| | | | |
|---|---|---|---|
| 2015/0204822 A1* | 7/2015 | Horan | G01N 21/1702 |
| | | | 73/643 |
| 2017/0074834 A1 | 3/2017 | Dehe et al. | |
| 2019/0230446 A1* | 7/2019 | Schultz | H04R 19/04 |
| 2019/0323947 A1* | 10/2019 | Kolb | G01N 29/2418 |
| 2021/0247342 A1 | 8/2021 | Doshi et al. | |
| 2022/0237783 A1* | 7/2022 | Wong | G06T 7/0012 |

FOREIGN PATENT DOCUMENTS

| | | |
|---|---|---|
| CN | 114813609 A | 7/2022 |
| CN | 111510836 B | 8/2022 |
| CN | 114598979 B | 8/2022 |
| CN | 114915894 A | 8/2022 |

OTHER PUBLICATIONS

International Search Report and Written Opinion of the International Searching Authority in relation to International Application No. PCT/US2023/029675, dated Nov. 15, 2023, 11 pages.

* cited by examiner

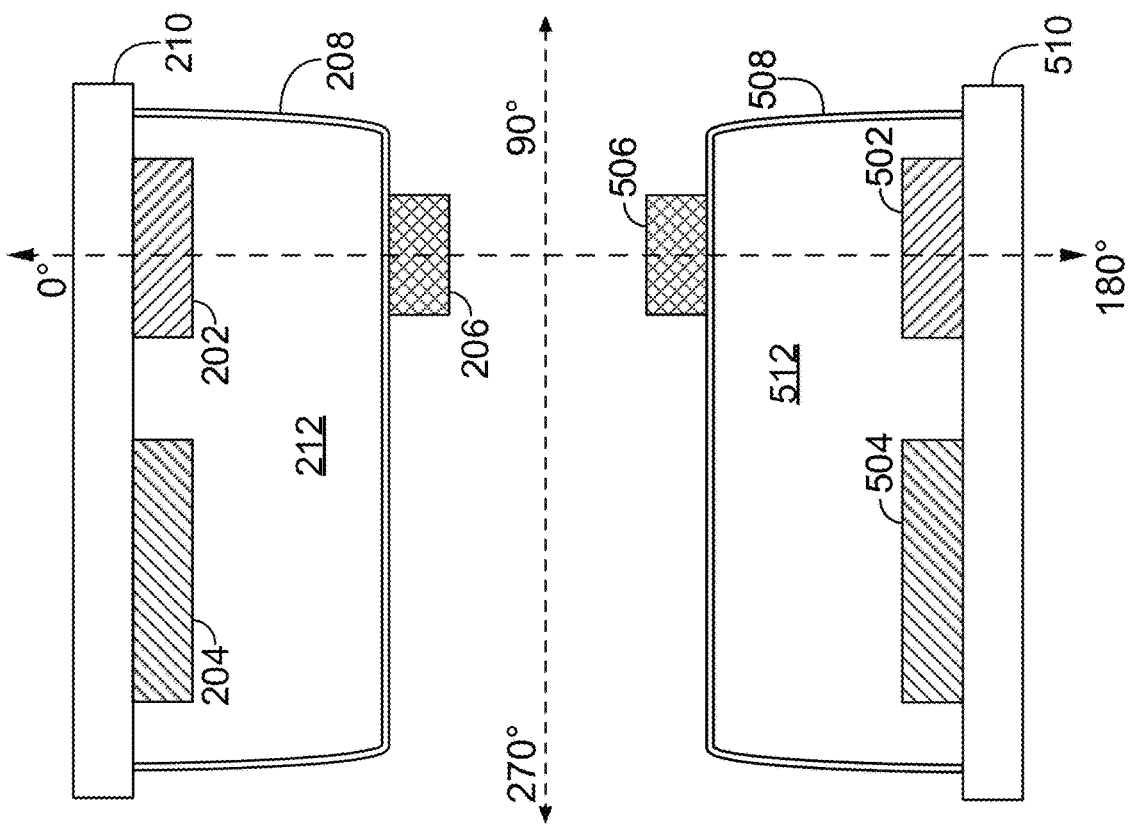
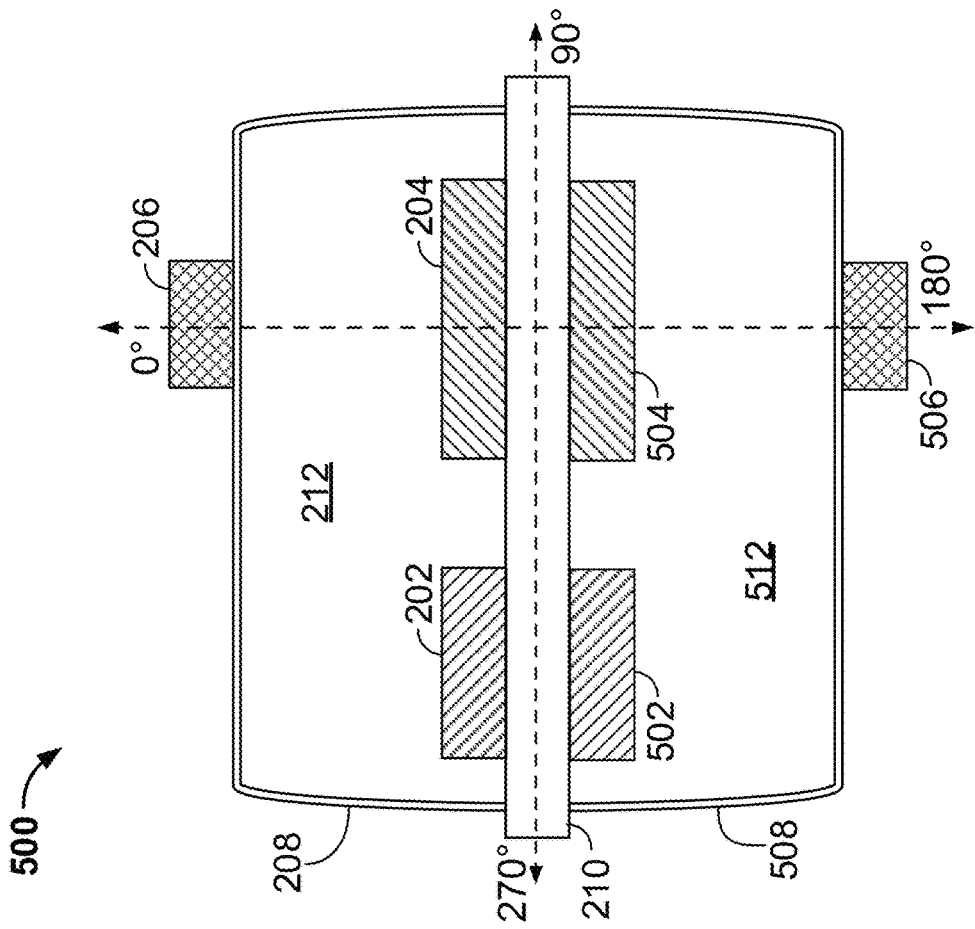
FIG. 5B
FIG. 5C

PHOTOACOUSTIC GAS SENSORS WITH IMPROVED SIGNAL-TO-NOISE RATIO

BACKGROUND

A photoacoustic gas sensor (PAGS) detects a concentration of a particular external gas, which may access the sensor's photoacoustic cell via a port, based on the external gas's interaction with radiation emitted from an electromagnetic radiation source within the photoacoustic cell. The photoacoustic cell includes a radiation source that emits radiation of a particular wavelength at a modulation frequency, which modulates the temperature of the molecules of the external gas within the photoacoustic cell to produce pressure waves (e.g., acoustic signals) received by a MEMS diaphragm. The MEMS diaphragm moves in accordance with the received pressure waves to generate a MEMS diaphragm (e.g., microphone) output signal.

The photoacoustic cell, via the port, simultaneously receives ambient noise signals (e.g., from lab equipment, computer fans, a heating, ventilation, and air conditioning (HVAC) system, etc.) from the surrounding environment of the photoacoustic gas sensor, which interfere with the portion of the microphone output signal due to the acoustic pressure wave and degrade the signal-to-noise ratio (SNR) of the gas sensor. In addition, due to a high noise floor and a prevalence of noise at certain frequencies, the frequency and wavelength of the radiation emitted by the radiation source is unable to be operated at certain frequencies that may otherwise be desirable.

SUMMARY

In an embodiment of the present disclosure, a system for improving signal-to-noise ratio in a photoacoustic gas sensor comprises a substrate, at least one MEMS diaphragm, an electromagnetic radiation source, and at least one photoacoustic cell, wherein the at least one photoacoustic cell includes at least one port configured to receive an external gas in at least one volume defined by the at least one photoacoustic cell. The system may further comprise a first acoustic signal path, via the at least one port of the at least one photoacoustic cell, to the at least one MEMS diaphragm, and a second acoustic signal path, via the at least one port of the at least one photoacoustic cell, to the at least one MEMS diaphragm. The system may further comprise processing circuitry configured to determine a bi-directional response based on one or more signals from the at least one MEMS diaphragm, wherein noise of an output signal corresponding to a concentration of a gas of interest is reduced based on the bi-directional response.

In an embodiment of the present disclosure, a method for improving signal-to-noise ratio in a photoacoustic gas sensor comprises steps of emitting radiation from an electromagnetic radiation source and receiving, by at least one MEMS diaphragm, a first acoustic signal via a first acoustic signal path and a second acoustic signal via a second acoustic signal path, wherein the first acoustic signal path and the second acoustic signal path access the at least one MEMS diaphragm via at least one port of at least one photoacoustic cell, and wherein the at least one port of the at least one photoacoustic cell is configured to receive an external gas in at least one volume defined by the at least one photoacoustic cell. The method may also comprise determining, by processing circuitry, a bi-directional response based on one or more signals from the at least one MEMS diaphragm, wherein noise of an output signal corresponding to a concentration of a gas of interest is reduced based on the bi-directional response.

In an embodiment of the present disclosure, a photoacoustic gas sensor comprises a substrate, an electromagnetic radiation source, a first photoacoustic cell including a first port configured to expose a first interior volume of the first photoacoustic cell to an external environment, and a second photoacoustic cell including a second port configured to expose a second interior volume of the second photoacoustic cell to the external environment. The photoacoustic gas sensor may further comprise at least one MEMS diaphragm exposed to the first interior volume and the second interior volume, an electromagnetic radiation source located within the first interior volume and configured to emit a radiation pattern, wherein the radiation pattern causes a gas of interest to generate an acoustic signal corresponding to the radiation pattern, and a dummy electromagnetic radiation source located within the second interior volume. The photoacoustic gas sensor may further comprise processing circuitry configured to generate a signal corresponding to the gas of interest based on an output of the at least one MEMS diaphragm, wherein ambient noise is cancelled from the signal corresponding to the gas of interest.

BRIEF DESCRIPTION OF DRAWINGS

The above and other features of the present disclosure, its nature, and various advantages will be more apparent upon consideration of the following detailed description, taken in conjunction with the accompanying drawings in which:

FIG. 5B shows an illustrative bi-directional gas sensing system with opposite photoacoustic cells comprising multiple MEMS diaphragms, in accordance with an embodiment of the present disclosure;

FIG. 5C shows an illustrative bi-directional gas sensing with opposite, port-facing photoacoustic cells comprising multiple MEMS diaphragms, in accordance with an embodiment of the present disclosure;

DETAILED DESCRIPTION OF THE DRAWINGS

Figure 1:
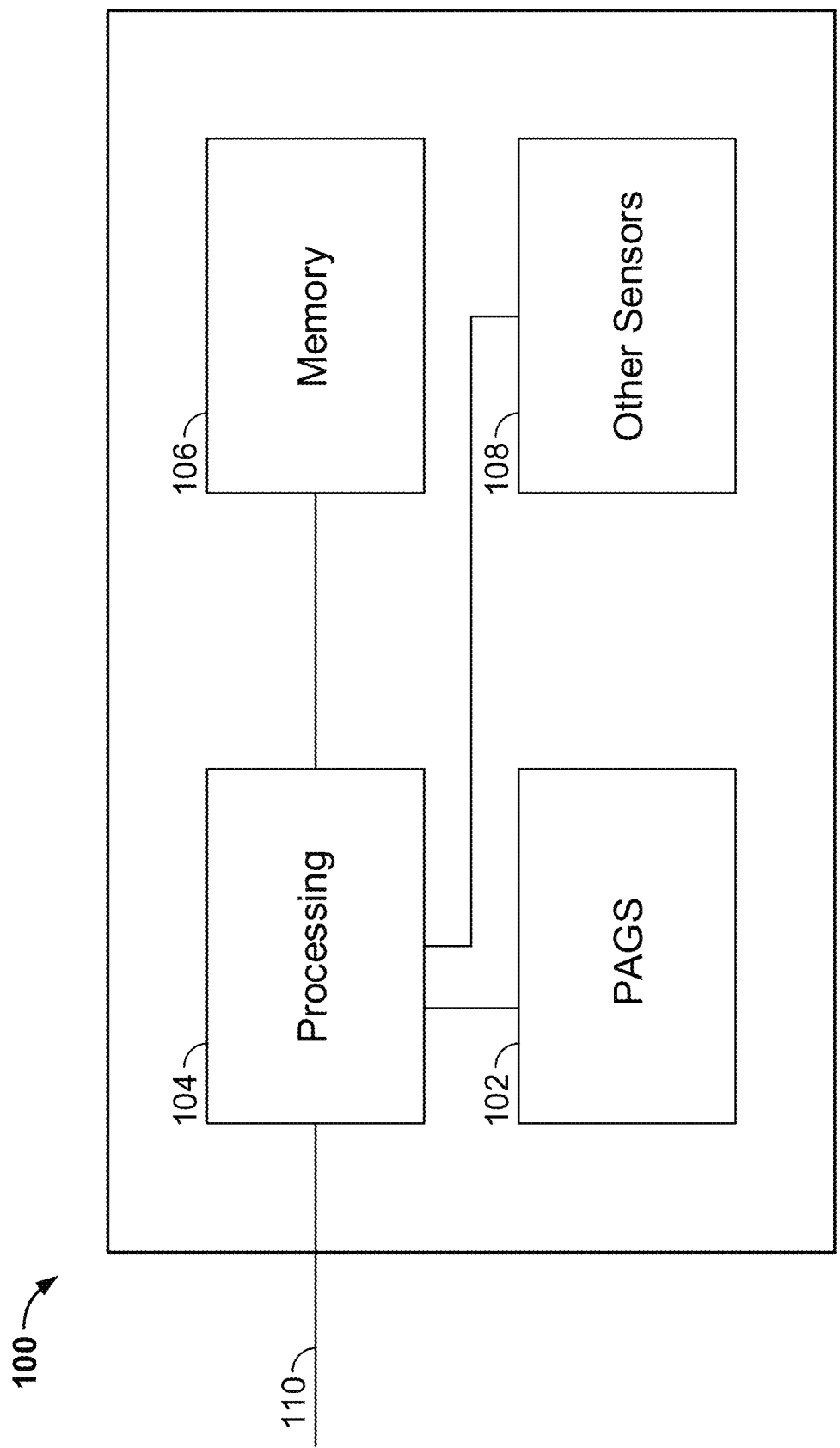
FIG. 1 shows an illustrative PAGS system, in accordance with an embodiment of the present disclosure.

A photoacoustic gas sensor (PAGS) defines in interior volume that receives gas from an external environment via one or more ports. An electromagnetic radiation source emits radiation at a wavelength that causes a gas of interest, when present within the interior volume, to emit a pressure wave having an intensity based on the concentration of the gas of interest within the volume. The radiation is pulsed in a pattern (e.g., a periodic pattern) such that the acoustic signal resulting from the pressure wave is recognizable in accordance with the pattern. A MEMS diaphragm moves in response to the pressure wave and outputs an omni-directional signal that corresponds to the concentration of the gas of interest.

The port of the PAGS also allows acoustic signals from ambient noise to enter the internal volume via a first signal path and thus cause movement of the MEMS diaphragm. The radiation pattern of the electromagnetic radiation source, and thus, the frequency of the acoustic signal corresponding to the gas of interest, may have highest resolution at relatively low frequencies. The ambient noise may also have significant signal content at these frequencies when sensed via an omni-directional sensor, reducing the signal-to-noise ratio of gas sensing at these lower frequencies. To reduce the impact of ambient noise and improve the signal-to-noise ratio, a second photoacoustic gas sensor is exposed to the same external environment as the first photoacoustic gas sensor described in the preceding paragraph. The second photoacoustic gas sensor does not include an electromagnetic radiation source, such that no pressure waves are generated based on the gas of interest. Instead, the second photoacoustic gas sensor is designed and located in a manner such that it receives the ambient noise signal in accordance with a known relationship. For example, the second photoacoustic sensor may have an internal volume size, port location, relative location, relative orientation, and other parameters selected such that a received ambient signal via a second signal path has a known and predictable relationship with the same ambient signal received via the first signal path. A dummy electromagnetic radiation source may also be included within the second photoacoustic gas sensor to mimic the acoustic conditions of the internal volume of the first photoacoustic gas sensor.

The contribution of the ambient noise signal to the overall received signal may be cancelled based on the configuration of the respective photoacoustic gas sensors, resulting in bi-directional sensing of the gas of interest. In one example, the second photoacoustic gas sensor includes its own MEMS diaphragm that responds only to the ambient noise signal, while the MEMS diaphragm of the first photoacoustic gas sensor responds to both the ambient noise signal and the acoustic signal corresponding to the gas of interest. The signals from the MEMS diaphragms are filtered by processing circuitry (e.g., based on known scaling between the signals) to remove the ambient noise from the output signal of the first photoacoustic gas sensor. In another example, the first and second photoacoustic gas sensors are stacked such that the MEMS diaphragm of the first photoacoustic gas sensor is shared with the second photoacoustic gas sensor. The internal volume of the first photoacoustic gas sensor is exposed to one side of the shared MEMS diaphragm while the internal volume of the second photoacoustic gas sensor is exposed to the other side of the MEMS diaphragm. Based on the design parameters of the respective photoacoustic gas sensors, the ambient noise signal provides a similar acoustic signal to both sides of the MEMS diaphragm, resulting in physical cancellation of the ambient noise signal at the MEMS diaphragm.

FIG. 1 shows an illustrative photoacoustic gas sensor system in accordance with an embodiment of the present disclosure. Although particular components are depicted in FIG. 1, it will be understood that other combinations of sensors, processing components, memory, and other circuitry may be utilized as necessary for different applications and systems. In certain embodiments of the present disclosure, the circuitry, devices, systems, and methods described herein may be described in the context of a PAGS sensor 102 system including at least one photoacoustic cell with at least one port providing a path for gas between an external volume and at least one photoacoustic cell, includes an electromagnetic radiation source, and at least one MEMS diaphragm. The at least one MEMS diaphragm receives acoustic signals generated withing the photoacoustic cell by the interaction of a gas of interest with an output of an electromagnetic radiation source, and also receives an external acoustic noise signal received via the at least one port via a plurality of acoustic signal paths. The at least one MEMS diaphragm generates corresponding MEMS diaphragm output signals that are processed to determine a bi-directional response of the at least one MEMS diaphragm, which is effective in removing the noise generated by the external acoustic signal.

Processing circuitry 104 may include one or more components providing necessary processing based on the requirements of the PAGS system 100. In some embodiments, processing circuitry 104 may include hardware control logic that may be integrated within a chip of a sensor (e.g., on a base substrate of a PAGS sensor 102 or other sensor 108, or on an adjacent portion of a chip to the PAGS sensor 102 or other sensor 108) to control the operation of the PAGS sensor 102 or other sensors 108 and perform aspects of processing for the PAGS sensor 102 or the other sensors 108. In some embodiments, the PAGS sensor 102 and other sensors 108 may include one or more registers that allow aspects of the operation of hardware control logic to be modified (e.g., by modifying a value of a register). In some embodiments, processing circuitry 104 may also include a processor such as a microprocessor that executes software instructions, e.g., that are stored in memory 106. The microprocessor may control the operation of the PAGS sensor 102 by interacting with the hardware control logic and processing signals received from PAGS sensor 102. The microprocessor may interact with other sensors in a similar manner. In some embodiments, some or all of the functions of the processing circuitry 104, and in some embodiments, of memory 106, may be implemented on an application specific integrated circuit ("ASIC") and/or field programmable gate array ("FPGA").

Although in some embodiments (not depicted in FIG. 1), the PAGS sensor 102 or other sensors 108 may communicate directly with external circuitry (e.g., via a serial bus or direct connection to sensor outputs and control inputs), in an embodiment the processing circuitry 104 may process data received from the PAGS sensor 102 and other sensors 108 and communicate with external components via a communication interface 110 (e.g., a SPI or I2C bus, in automotive applications a controller area network (CAN) or Local Interconnect Network (LIN) bus, or in other applications suitably wired or wireless communications interfaces as is known in the art). The processing circuitry 104 may convert signals received from the PAGS sensor 102 and other sensors 108 into appropriate measurement units (e.g., based on settings provided by other computing units communicating over the communication bus 110) and perform more complex processing to determine measurements such as relating to sensed gases and gas concentrations. For example, PAGS sensor 102 and/or other sensors 108 may output the gas concentration of carbon dioxide, water, methane, etc. to processing circuitry 104, which in turn may calculate air quality index, a threshold warning, or scenario classification (e.g., bread burning vs. a house burning). It will be understood that the gas sensor and the microphone signals may be used together to detect a plurality of events or scenarios. In some embodiments, some or all of the conversions or calculations may take place on the hardware control logic or other on-chip processing of the PAGS sensor 102 or other MEMS sensors 108.

In accordance with the present disclosure, a configuration of a first photoacoustic cell includes a first port attached to it to allow an external gas access to its interior volume. The first photoacoustic cell includes a substrate and defines an interior volume that includes a first MEMS diaphragm and a first electromagnetic radiation source coupled. In an embodiment, a second photoacoustic cell has similar components to the first photoacoustic cell, except that there is no electromagnetic radiation source, and in some embodiments of vertically stacked first and second photoacoustic cells, the first and second photoacoustic cells may share the first MEMS diaphragm with acoustic sources being provided to both sides of the shared MEMS diaphragm. The second photoacoustic cell may include a dummy electromagnetic radiation source having a similar shape and/or acoustic properties as the first electromagnetic radiation source is located within the interior volume of the second photoacoustic cell to simulate, within this second interior volume, the acoustic response within this first interior volume. In different embodiments the first photoacoustic cell and the second photoacoustic cell may be located at different relative locations with respect to each other, such as side by side or vertically stacked.

External gas molecules (e.g., carbon dioxide, water, carbon monoxide, methane, ammonia, nitrogen oxide, formaldehyde, ethanol, acetone, etc.) enter the interior volume of the first photoacoustic cell, via the first port, and interact (e.g., heat up and cool down) in response to radiation (e.g., near infrared wavelength) emitted from the electromagnetic radiation source in a modular, pulsed manner, to generate pressure waves (e.g., acoustic signals) that are detected by the first MEMS diaphragm. The described embodiments apply to any gas that exhibits a photoacoustic response. Concurrently, the first MEMS diaphragm picks up ambient noise signals (e.g., computer fans, a heating, ventilation, and air conditioning (HVAC) system, any mechanical noise near the gas sensor, etc.) from the immediate environment surrounding the first photoacoustic cells, which travel through the first port to the first MEMS diaphragm as well. In response to receiving the pressure waves and ambient noise signals, the first MEMS diaphragm produces a first MEMS diaphragm output signal (e.g., an omni-directional response), including a pressure wave component and an ambient noise component, that is received by processing circuitry within the substrate.

Gas molecules also enter the second photoacoustic cell via the second port, however, the dummy electromagnetic radiation source fails to emit radiation, so no pressure waves are generated within the second photoacoustic cell. The dummy electromagnetic radiation source, which attaches to the substrate, serves to match the size of the electromagnetic radiation source in the first photoacoustic cell so that the interior volume of the second photoacoustic cell is the same or similar as the interior volume of the first photoacoustic cell. Accordingly, the acoustic compliance of the second photoacoustic cell is similar to that of the first photoacoustic cell. The second MEMS diaphragm detects the ambient noise signals, which enter the second photoacoustic cell via the second port, and produces a second MEMS diaphragm output signal (e.g., an omni-directional response), solely including an ambient noise component, that is received by processing circuitry within the substrate. Processing circuitry takes the difference of the first MEMS diaphragm output signal, including the pressure wave component and the ambient noise component, and the second MEMS diaphragm output signal, solely including the ambient noise component, to generate a bi-directional response (e.g., to isolate the pressure wave component received by the first MEMS diaphragm) and improve the signal-to-noise ratio (SNR) of the gas sensor. In some embodiments, the second photoacoustic cell may include the electromagnetic radiation source, while the first photoacoustic cell may include the dummy electromagnetic radiation source.

In some embodiments, a configuration of a first photoacoustic cell, with a first port attached to it to allow an external gas and/or ambient noise signals access to its interior volume, coupled to a substrate, where the first photoacoustic cell encompasses a first side of a MEMS diaphragm and an electromagnetic radiation source electrically coupled to the substrate, is opposite the substrate from a second photoacoustic cell, with a second port attached to it to allow the external gas and/or ambient noise signals access to its interior volume, coupled to the same substrate, where the second photoacoustic cell encompasses a second side of the MEMS diaphragm and a dummy electromagnetic radiation source. External gas molecules (e.g., carbon dioxide, water, carbon monoxide, methane, ammonia, nitrogen oxide, formaldehyde, ethanol, acetone, etc.) enter the first photoacoustic cell, via the first port, interact (e.g., heat up and cool down) with radiation (e.g., near infrared wavelength) emitted from the electromagnetic radiation source in a modular, pulsed manner, and generate pressure waves (e.g., acoustic signals) that are detected by the first side of the MEMS diaphragm. Concurrently, the first side of the MEMS diaphragm picks up ambient noise signals (e.g., computer fans, a HVAC system, any mechanical noise near the gas sensor, etc.) from the immediate environment surrounding the first and second photoacoustic cells, which travel through the first port to the first side of the MEMS diaphragm. Ultimately, the first side of the MEMS diaphragm simultaneously receives pressure waves and ambient noise signals.

External gas molecules also enter the second photoacoustic cell via the second port, however, the dummy electromagnetic radiation source fails to emit radiation, so no pressure waves are generated within the second photoacoustic cell. The dummy electromagnetic radiation source, which attaches to the substrate, serves to match the size of the electromagnetic radiation source in the first photoacoustic cell so that the interior volume of the second photoacoustic cell is the same or similar as the interior volume of the first photoacoustic cell. Accordingly, the acoustic compliance of the second photoacoustic cell is similar to that of the first photoacoustic cell. A gap extends through the substrate so that the second side of the MEMS diaphragm can detect ambient noise signals that have entered the second photoacoustic cell via the second port, which are substantially similar to the ambient noise signals received within the first photoacoustic cell based on the propagation properties of the noise signal and the relative locations of the photoacoustic cells, as described herein. The gas sensor exhibits a bi-directional response across the first and second sides of the MEMS diaphragm, such that the MEMS diaphragm responds to a difference in sound pressure (e.g., the pressure waves) between the received signals on the two sides of the MEMS diaphragm to determine a bi-directional response (e.g., mechanically cancel the ambient noise signals) and improve the SNR of the gas sensor.

Figure 2:
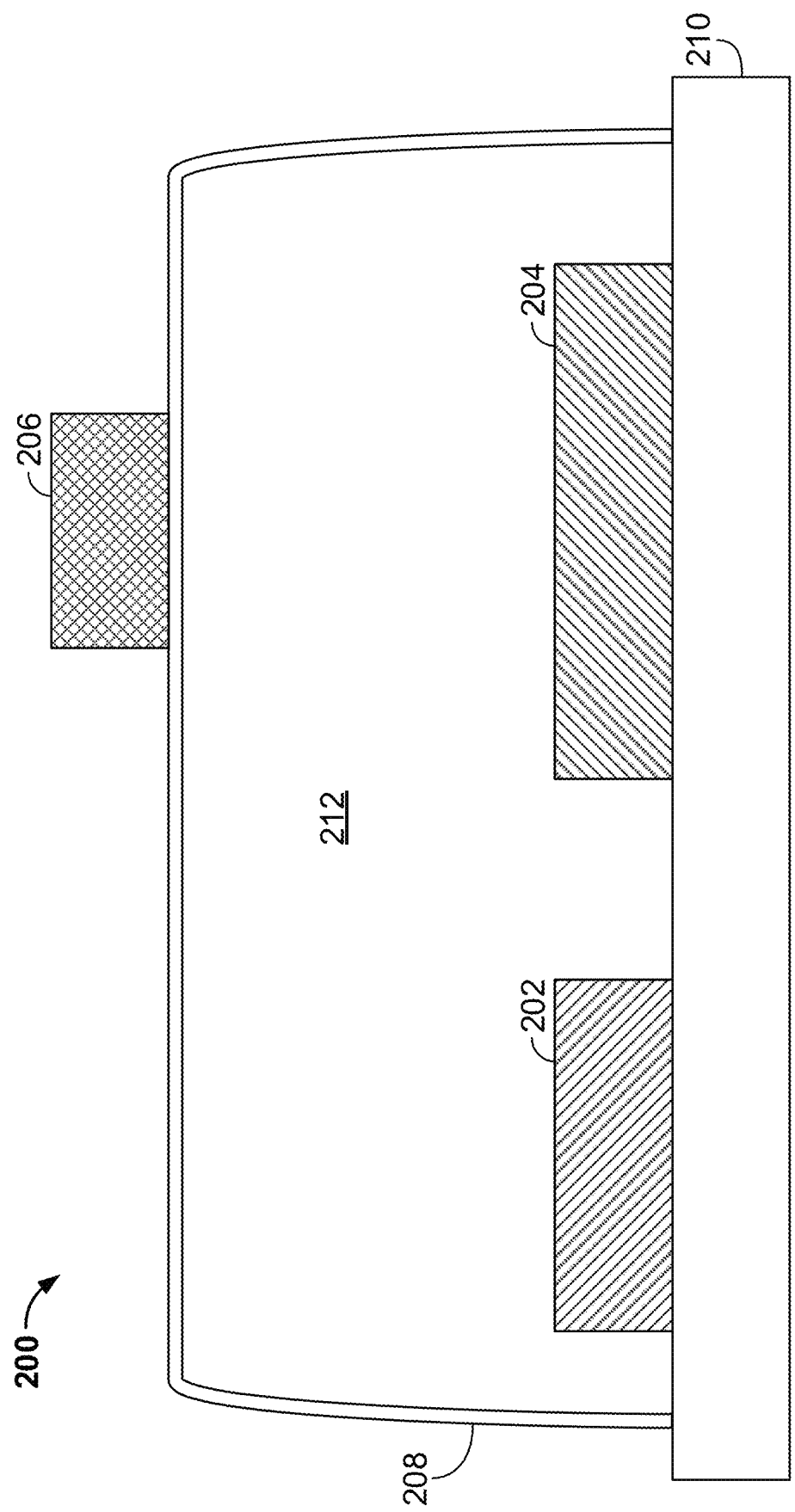
FIG. 2 shows an illustrative omni-directional gas sensing system, in accordance with an embodiment of the present disclosure.

FIG. 2 shows an illustrative gas sensing system, in accordance with an embodiment of the present disclosure. In the depicted embodiment, photoacoustic cell 200 includes MEMS diaphragm 202, electromagnetic radiation source 204, port 206, photoacoustic cell cover 208, substrate 210, and interior volume 212. Although particular components are depicted in certain configurations for photoacoustic cell 200, it will be understood that components may be removed, modified, or substituted and that additional components (e.g., processing circuitry, ports, etc.) may be added in certain embodiments. Photoacoustic cell cover 208 attaches to substrate 210 to define the interior volume 212 and protects internal components from external stressors or hazards (e.g., heat, light, particles, etc.) that may alter the functionality of photoacoustic cell 200. The size of photoacoustic cell cover 208, which may be a variety of sizes, defines interior volume 212.

MEMS diaphragm 202 is depicted in a simplified manner in FIG. 2 and in the present description. It will be understood that MEMS diaphragm 202 may be a component of a MEMS sensor such as a MEMS microphone, which include various components such as supports, electrical connections, interior volumes, backplates, and the like. MEMS diaphragm 202 is coupled to substrate 210 within photoacoustic cell cover 208 (e.g. via supports, not depicted). In some embodiments, there may be multiple MEMS diaphragms within photoacoustic cell 200. MEMS diaphragm 202 is sensitive to acoustic energy such as ambient noise signals (e.g., far-field and diffuse-field ambient noise) and pressure waves (e.g., near-field acoustic signals). Photoacoustic cell 200 receives an external gas (e.g., carbon dioxide, water, carbon monoxide, methane, ammonia, nitrogen oxide, formaldehyde, ethanol, or acetone), via port 206, from the external volume within the interior volume 212. The gas within the interior volume reacts to radiation (e.g., near infrared wavelength) emitted in a modular, pulsed manner (e.g., at modulation frequency) by electromagnetic radiation source 204, resulting in the generation of a pulsed near-field acoustic signal that is sensed by MEMS diaphragm 202. The electromagnetic radiation has a wavelength in accordance with a gas of interest, for example, per the table 1 below:

TABLE 1

Radiation Wavelength for Particular Gases of Interest

| Gas Name | Radiation Wavelength (μm) |
|---|---|
| Carbon dioxide (CO2) | 4.2-4.3 |
| Water (H2O) | 2.8-3.1 |
| Carbon monoxide (CO) | 4.6-4.7 |
| Methane (CH4) | 3.2-3.4, 7.2-8.0 |
| Ammonia (NH3) | 10.3-10.8 |
| Nitrogen Oxide (NO) | 5.1 -5.6 |
| Formaldehyde (HCHO) | 5.5-5.9 |
| Ethanol (C2H5OH) | 9.1-9.7 |
| Acetone (C3H6O) | 5.6-5.85, 7.2-7.45, 8.05-8.4 |

The electromagnetic radiation source 204 attaches to substrate 210 within photoacoustic cell cover 208 and, in some embodiments, may electrically couple to substrate 210. The radiation from electromagnetic radiation source 204 interacts with the external gas by heating up and cooling down its molecules, which generates pressure waves (e.g., acoustic signals) that are detected by MEMS diaphragm 202. Concurrently, MEMS diaphragm 202 picks up ambient noise signals (e.g., generated from computer fans, an HVAC system, lab equipment, etc.) from the immediate surrounding environment of photoacoustic cell 200 via port 206. It will be understood that there may be multiple ports and a variety of port shapes for photoacoustic cell 200.

In some embodiments, port 206 may incorporate acoustic filtering, such as low-pass filtering, by selection of a filter acoustic resistance or port acoustic mass. For example, port 206 may implement a cutoff frequency of 1 kHz, where ambient noise signals with frequencies up to 1 kHz may enter photoacoustic cell cover 208, via port 206, and reach MEMS diaphragm 202, and where port 206 may attenuate ambient noise signals with frequencies greater than 1 kHz so that they reach MEMS diaphragm 202 with decreasing amplitude versus frequency. In some embodiments, the cutoff frequency of port 206 may be determined by its diameter, length, and acoustic resistance in conjunction with the acoustic compliance of the photoacoustic cell. In some embodiments, further electronics filtering may be utilized (e.g., a band-pass filter, a band-stop filter, a low-band-pass filter, a band-high-pass filter, a low-band-high-pass filter, etc.).

It will be understood that the pressure waves, generated by external gas molecules interacting with emitted radiation within photoacoustic cell cover 208, pulse at an audio bandwidth based on the frequency of the emitted radiation pattern from electromagnetic radiation source 204 (e.g., 20 Hz to 20 kHz in an embodiment). A Photoacoustic Gas Sensing Model, depicted below, shows variables that contribute to the intensity (e.g., amplitude size) of the near-field pressure waves received by MEMS diaphragm 202 based on the electromagnetic radiation source 204 and gas content.

$$p(\omega) = \frac{(\gamma - 1)\alpha l W_l}{\omega V_{cell}} \quad (1)$$

where:
$p(\omega)$=photoacoustically generated pressure wave amplitude
$\gamma$=adiabatic coefficient of gas
$\alpha$=absorption coefficient of the gas
$l$=radiation pass length
$W_l$=radiation incident power
$\omega$=radiation modulation frequency
$V_{cell}$=cell volume The amplitude of pressure wave "p(ω)" increases as the radiation modulation frequency "ω" decreases, meaning a lower radiation modulation frequency, emitted by electromagnetic radiation source 204, corresponds with higher intensity pressure waves received by MEMS diaphragm 202. For example, if the radiation modulation frequency were to decrease by half, the pressure wave amplitude would double. In addition, decreased photoacoustic cell cover 208 volume "$V_{cell}$" corresponds with increased pressure wave amplitude, meaning a decrease in cell volume results in higher intensity pressure waves received by MEMS diaphragm 202a also. For example, if the photoacoustic cell cover 208 volume were to decrease to a quarter of its size, the pressure wave amplitude would quadruple.

In a typical ambient noise environment, the ambient noise amplitude is greater at lower frequencies. The presence of this noise degrades the SNR of the photoacoustic signal detection, particularly since the pressure wave also has higher amplitudes at lower frequencies.

MEMS diaphragm 202 is fabricated as a relatively thin layer of material and has a shape that collectively facilitates movement of the MEMS diaphragm 202 in response to pressure waves (e.g., acoustic signals) and ambient noise signals. In some embodiments, a back plate (not visible) located parallel with MEMS diaphragm 202 may be fabricated as a relatively thick layer of material that does not appreciably move in response to the received pressure waves and/or ambient noise signals. In some embodiments, MEMS diaphragm 202 and the back plate may be at a respective potential (e.g., based on electrical connections to processing circuitry via substrate 210) such that a capacitance is formed between MEMS diaphragm 202 and the back plate. MEMS diaphragm 202 may move relative to the back plate based on received pressure waves and/or ambient noise signals, resulting in a change in capacitance between MEMS diaphragm 202 and the back plate that is representative of the received pressure waves and/or ambient noise signals. The sensed capacitance is provided to processing circuitry in the form of a MEMS diaphragm output signal, which, in the embodiment of FIG. 2, is processed and used to determine an omni-directional response (e.g., only to acoustic signals received from interior volume 212) of photoacoustic cell 200, including pressure wave and ambient noise components. In some embodiments, processing circuitry may be external to photoacoustic cell 200. The intensity of pressure waves received by MEMS diaphragm 202 depends on a concentration of the external gas of interest within the interior volume 212 of photoacoustic cell cover 208.

Figure 3:
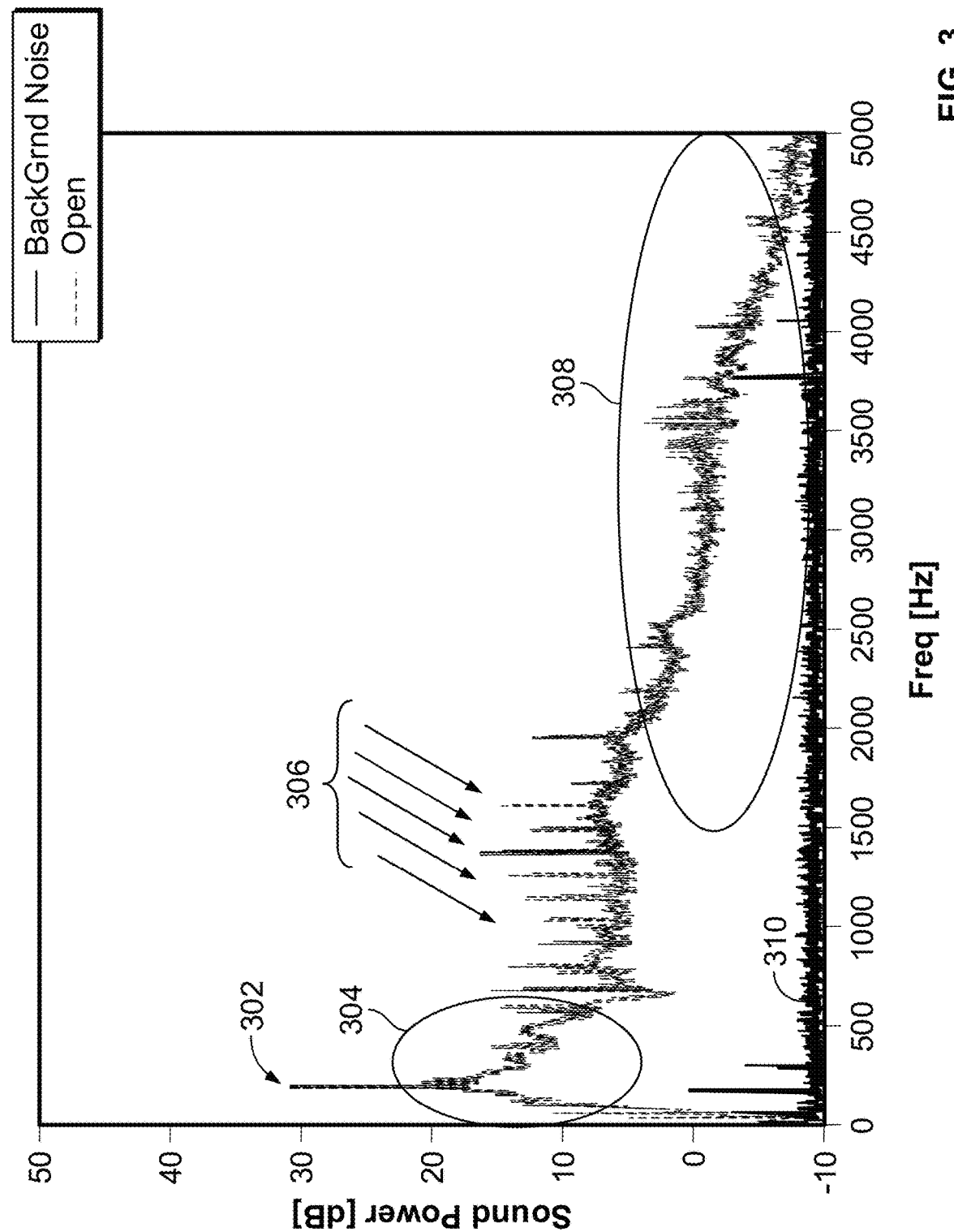
FIG. 3 shows an example diagram depicting a noise spectrum for an electronic component located with a gas sensor in an electronic device, in accordance with an embodiment of the present disclosure.

FIG. 3 shows an example diagram depicting a noise spectrum for an electronic component located with a gas sensor in an electronic device, in accordance with an embodiment of the present disclosure. FIG. 3 displays a typical noise spectrum of a 120 mm diameter electronic device cooling fan, which includes 7 blades, has four struts for motor mounting, and operates at 13 volts. One MEMS diaphragm (e.g., implementing a microphone) was positioned at a point 1 m upstream from the fan. Tonal noise 302 at blade pass frequency (BPF), approximately 250 Hz, is generated by the cooling fan due to an aerodynamic interaction between a rotating impeller (e.g., a rotor used to increase the pressure and flow of air) and a stationary diffuser vane. The tonal noise 302 occurs due to pressure fluctuation that is related to the rotating speed of the fan impeller, which holds the fan's blades. It will be understood that the tonal noise is periodic in time and includes the BPF as well as its harmonics (e.g., integer multiples of its fundamental frequency). BPF noise level intensity has a direct relationship with the number of blades and the rotation speed of the fan impeller (e.g., BPF increases if the fan's rotation velocity increases and/or the number of blades increases). BPF may be expressed by the subsequent equation.

$$BPF = (n * t)/60 \quad (2)$$

where:
BPF=blade pass frequency (Hz)
n=rotation velocity (rpm)
t=number of blades Spread of continuous noise 304 represents a portion of the loudness spectrum (e.g., between approximately 10 and 20 decibels) the MEMS diaphragm detects (e.g., between approximately 0 and 500 Hz) while the cooling fan is running, which follows an inverse relationship between noise intensity and frequency. Discrete frequency noise elements 306 represent harmonics (e.g., integer multiples of a fundamental frequency) of the BPF that contribute to the tonal noise 302 generated by the cooling fan. For example, if the BPF is 150 Hz (e.g., its fundamental frequency—$f_o$), possible harmonics may be 300 Hz (e.g., $2*f_o$), 450 Hz (e.g., $3*f_o$), and 600 Hz (e.g., $4*f_o$). Broadband noise 308 also conveys an inversely proportional relationship between noise intensity (e.g., amplitude) and frequency. As depicted by FIG. 3, broadband noise 308 decreases as frequency increases. Conversely, as frequency decreases, broadband noise 308 increases.

Figure 4:
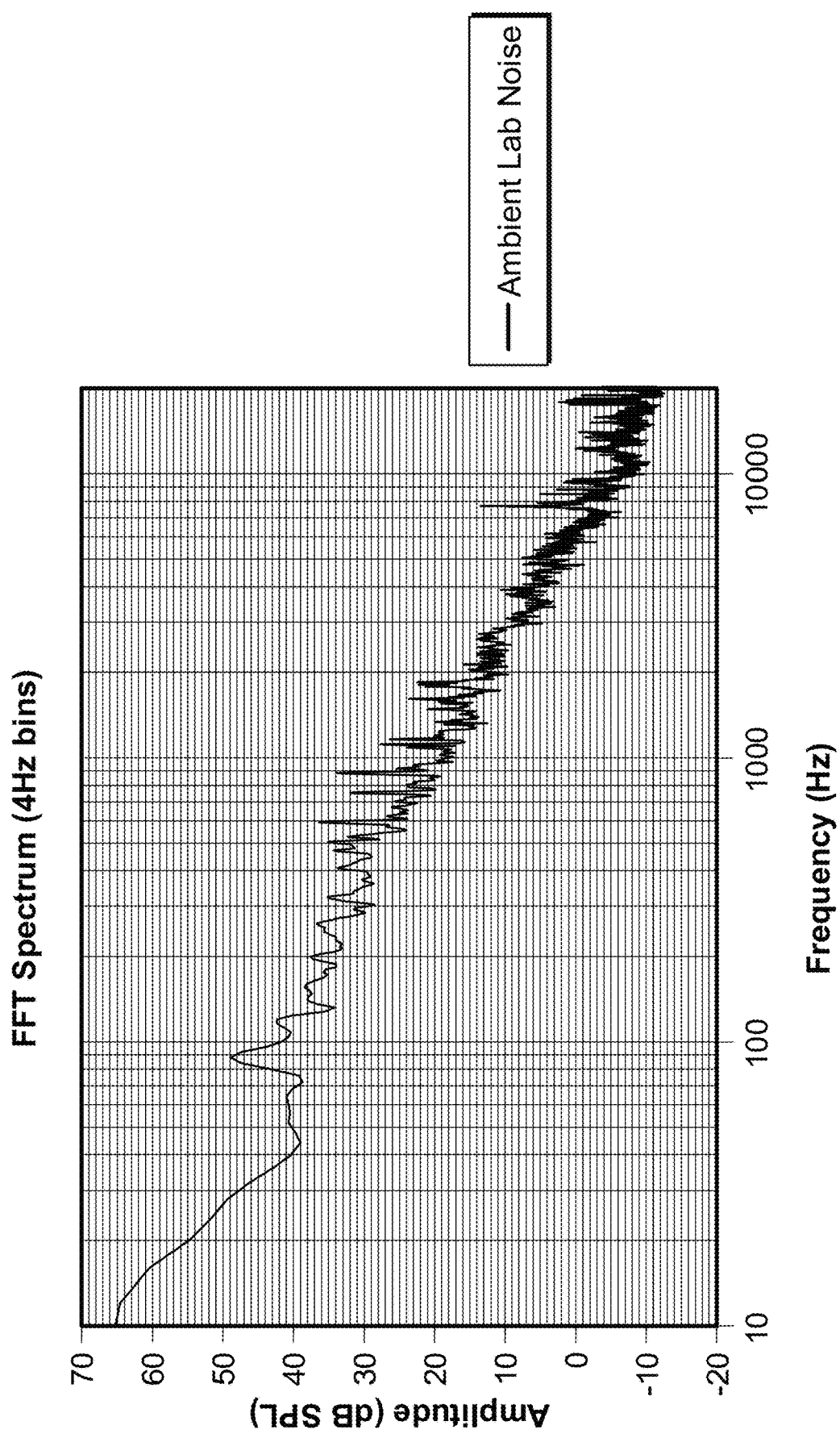
FIG. 4 shows an example diagram depicting a noise spectrum for an exemplary working environment, in accordance with an embodiment of the present disclosure.

FIG. 4 shows an example diagram depicting a noise spectrum for an exemplary working environment, in accordance with an embodiment of the present disclosure. Similar to FIG. 3, FIG. 4 displays a typical, ambient, and acoustic noise spectrum, the only difference being the noise source includes a variety of mechanical and laboratory equipment and an HVAC system operating in the laboratory space, as opposed to the cooling fan described above. Nevertheless, the noise spectrum conveys an inverse relationship between noise intensity (e.g., amplitude) and frequency (e.g., 1/f—as frequency decreases noise level increases and as frequency increases noise level decreases).

Figure 5A:
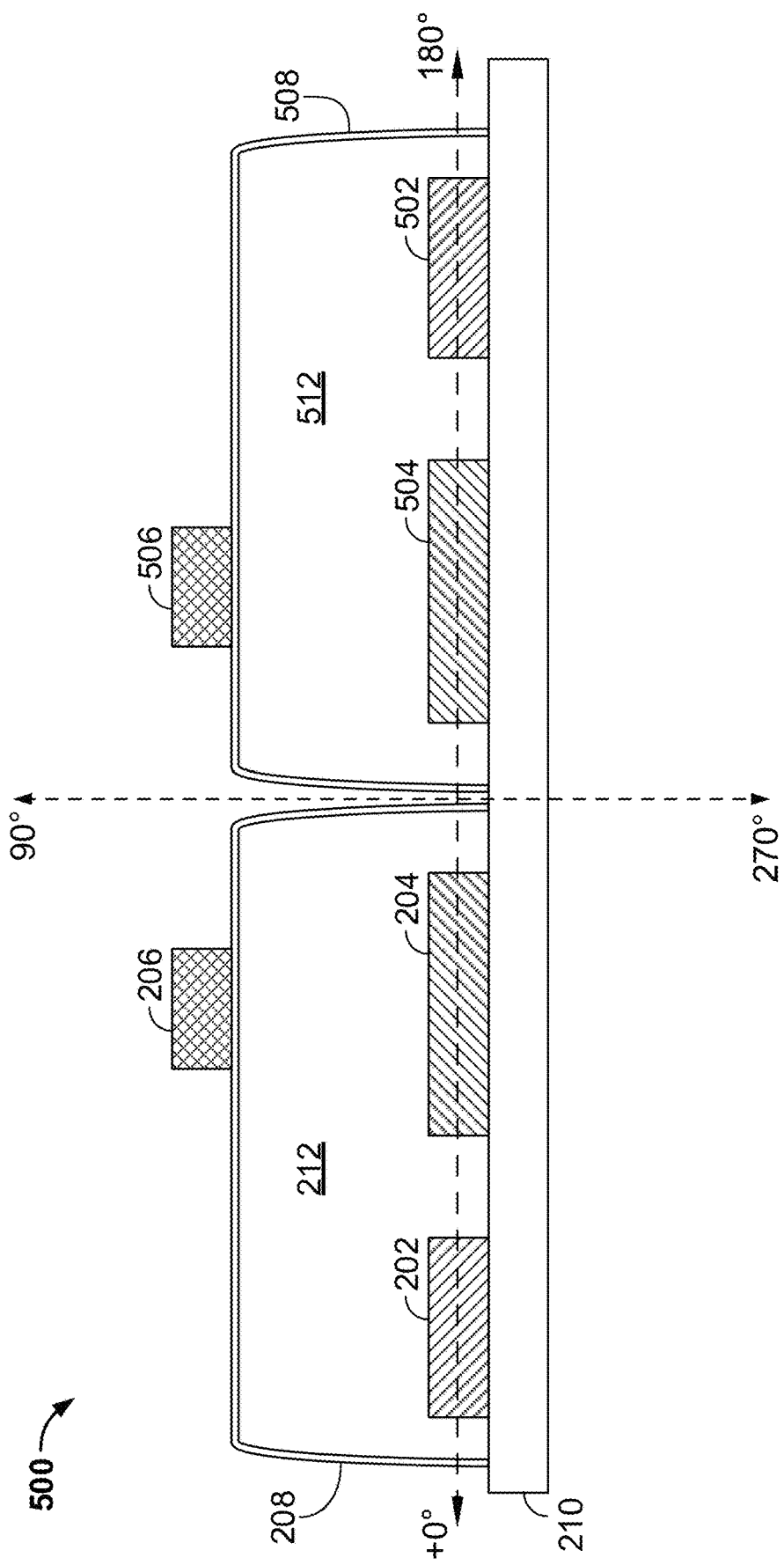
FIG. 5A shows an illustrative bi-directional gas sensing system with adjacent photoacoustic cells comprising multiple MEMS diaphragms, in accordance with an embodiment of the present disclosure.

FIG. 5A shows an illustrative bi-directional gas sensing system with adjacent photoacoustic cells comprising multiple MEMS diaphragms, in accordance with an embodiment of the present disclosure. Photoacoustic cell system 500 includes MEMS diaphragm 202, electromagnetic radiation source 204, port 206, photoacoustic cell cover 208, substrate 210, and interior volume 212 of FIG. 2. In addition, the depicted embodiment of photoacoustic cell system 500 includes second MEMS diaphragm 502, dummy electromagnetic radiation source 504, second port 506, second photoacoustic cell cover 508, and second interior volume 512. Although particular components are depicted in certain configurations for photoacoustic cell system 500, it will be understood that components may be removed, modified, or substituted (e.g., FIG. 5B and FIG. 5C) and that additional components (e.g., processing circuitry, ports, etc.) may be added in certain embodiments.

Second port 506 is located relatively close to and oriented in the same manner as first port 206, and thus, receives a similar ambient noise signal as that received by first port 206. In this manner, the interior volume 512 exposes second MEMS diaphragm 504 to the same or similar ambient noise signal that first MEMS diaphragm 202 is exposed to via first port 206. Second MEMS diaphragm 502 is coupled to substrate 210 within the interior volume 512 defined by second photoacoustic cell cover 508. There may be multiple MEMS diaphragms within the second photoacoustic cell of photoacoustic cell system 500. MEMS diaphragm 502 is sensitive to ambient noise signals (e.g., far-field and diffuse-field ambient noise) received via second port 506. Second MEMS diaphragm 502 is fabricated as a relatively thin layer of material and has a shape that collectively facilitates movement of the second MEMS diaphragm 502 in response to an ambient noise signal. In some embodiments, a back plate (not visible) located parallel with second MEMS diaphragm 502 may be fabricated as a relatively thick layer of material that does not appreciably move in response to the received ambient noise signal. In some embodiments, second MEMS diaphragm 502 and the back plate may be at a respective potential (e.g., based on electrical connections to processing circuitry via substrate 210) such that a capacitance is formed between second MEMS diaphragm 502 and the back plate. Second MEMS diaphragm 502 may move relative to the back plate based on the received ambient noise signal, resulting in a change in capacitance between second MEMS diaphragm 502 and the back plate that is representative of the received ambient noise signal.

Dummy electromagnetic radiation source 504, which attaches to substrate 210 within second photoacoustic cell cover 508, doesn't emit radiation and, therefore, doesn't cause the generation of pressure waves as a result of radiation interacting with external gas molecules received via second port 506. Dummy electromagnetic radiation source 504 serves to match the size of electromagnetic radiation source 204 in photoacoustic cell cover 208, so second interior volume 512 of second photoacoustic cell cover 508 is the same or similar as interior volume 212 of photoacoustic cell cover 208. Accordingly, the acoustic compliance of second photoacoustic cell cover 508 is similar and/or scaled to that of photoacoustic cell cover 208. In further embodiments, dummy electromagnetic radiation source 504 may be located within photoacoustic cell cover 208, while electromagnetic radiation source 204 may be located within second photoacoustic cell cover 508 such that second MEMS diaphragm 502 is sensitive to ambient noise signals only and first MEMS diaphragm 202 is sensitive to ambient noise signals and pressure waves. External gas molecules (e.g., carbon dioxide, water, carbon monoxide, methane, ammonia, nitrogen oxide, formaldehyde, ethanol, acetone, etc.) and ambient noise signals enter second photoacoustic cell cover 508 via second port 506, which attaches to second photoacoustic cell cover 508 to allow access to second interior volume 512. In some embodiments, there may be multiple ports providing access to the second photoacoustic cell of photoacoustic cell system 500. In some embodiments, second port 506 may incorporate acoustic filtering, such as low-pass filtering, by selection of filter acoustic resistance, port acoustic mass, or interior volume 520. It will be understood that further electronic filtering may be used by second port 506.

Second photoacoustic cell cover 508 attaches to substrate 210 and, in some embodiments to encompass second MEMS diaphragm 502 and dummy electromagnetic radiation source 504 within interior volume 512. Photoacoustic cell cover 208 and second photoacoustic cell cover 508 attach to substrate 210 such that they are adjacent to one another, with their respective components (e.g., MEMS diaphragm 202, electromagnetic radiation source 204, and port 206 of photoacoustic cell cover 208 and second MEMS diaphragm 502, dummy electromagnetic radiation source 504, and second port 506 of second photoacoustic cell cover 508) being vertically symmetrical with each other, although other respective configurations and locations may be utilized in accordance with the present disclosure. Second photoacoustic cell cover 508 protects internal components from external stressors or hazards (e.g., heat, light, particles, etc.) that may alter the functionality of the second photoacoustic cell of photoacoustic cell system 500, and the size of second photoacoustic cell cover 508, which may be a variety of sizes, defines second interior volume 512. Substrate 210, which, in some embodiments, may include processing circuitry (e.g., an ASIC, a FPGA, etc.) may receive or facilitate the reception by processing circuitry a first MEMS diaphragm output signal (e.g., an omni-directional response) from MEMS diaphragm 202, including pressure wave and ambient noise components, and a second MEMS diaphragm output signal (e.g., an omni-directional response) from second MEMS diaphragm 502, including an ambient noise component.

The sensed capacitance from second MEMS diaphragm 502 is provided to processing circuitry (e.g., an ASIC, a FPGA, etc.) in the form of a second MEMS diaphragm output signal (e.g., an omni-directional response), which is processed by processing circuitry (e.g., of the photoacoustic cell system 500 and/or external thereto) and used to determine, in combination with the first MEMS diaphragm output signal (e.g., including a pressure wave and an ambient noise component) generated by MEMS diaphragm 202, a bi-directional response for photoacoustic cell system 500. The first MEMS diaphragm output signal is filtered based on the second MEMS diaphragm output signal, such as to directly subtract the ambient noise portion of the first MEMS diaphragm signal based on the second MEMS diaphragm output signal, which only includes the ambient noise signal component. As another example, the second MEMS diaphragm output signal may be scaled based on a known relationship between the first and second photoacoustic cells, such as interior volume or relative location, such that the ambient noise signal of the second MEMS diaphragm signal is appropriately scaled to match the ambient noise component of the first MEMS diaphragm signal. In this manner, the ambient noise signal is cancelled from the output signal of the first MEMS diaphragm 202, including at lower frequency ranges. This allows for the electromagnetic radiation source 204 to pulse at lower frequencies where the resulting pressure waves due to gas presence are more pronounced. In some embodiments, it may be desired to subtract the ambient noise signals below a particular frequency, f0, to improve PAGS SNR and to add the ambient noise signals above f0 to use the two microphones to detect external ambient signals of interest (e.g., occupancy detection, glass break, alarm signals, etc.).

FIG. 5B shows an illustrative bi-directional gas sensing system with opposite photoacoustic cells comprising multiple MEMS diaphragms, in accordance with an embodiment of the present disclosure, while FIG. 5C shows an illustrative bi-directional gas sensing system with opposite, port-facing photoacoustic cells comprising multiple MEMS diaphragms, in accordance with an embodiment of the present disclosure. System 500B and system 500C each include MEMS diaphragm 202, electromagnetic radiation source 204, port 206, photoacoustic cell cover 208, substrate 210, and interior volume 212 of FIG. 2 as well as second MEMS diaphragm 502, dummy electromagnetic radiation source 504, second port 506, second photoacoustic cell cover 508, and second interior volume 512 of FIG. 5A. As depicted by FIG. 5B, photoacoustic cell cover 208 is opposite substrate 210 from second photoacoustic cell cover 508, with both photoacoustic cell cover 208 and second photoacoustic cell cover 508 attached to substrate 210. In the embodiment depicted in FIG. 5B, the first photoacoustic cell, including photoacoustic cell cover 208, including MEMS diaphragm 202, electromagnetic radiation source 204, and port 206, is symmetric across substrate 210 with the second photoacoustic cell, including second photoacoustic cell cover 508, including second MEMS diaphragm 502, dummy electromagnetic radiation source 504, and second port 506, although in other embodiments the components need not be symmetric (e.g., may have different respective component locations and/or sizes). The configuration of FIG. 5B may function similar to the configuration of FIG. 5A to provide an ambient noise signal from the second MEMS diaphragm 502 that cancels (e.g., with scaling based on respective sensitivity) the portion of the first MEMS diaphragm 202 output signal, resulting in improved resolution of the pressure wave signal due to gas concentration, particularly at lower modulation frequencies.

FIG. 5C shows a first photoacoustic cell including photoacoustic cell cover 208, including first substrate 210, detached and opposite from second photoacoustic cell cover 508, including second substrate 510, with port first 206 of the second photoacoustic cell facing second port 506 of the second photoacoustic cell. System 500C includes an electrical connection (not depicted) between a first MEMS diaphragm 202 signal output of the first photoacoustic cell and a second MEMS diaphragm 502 signal output of the second photoacoustic cell, for example, at processing circuitry of one of the photoacoustic cells and/or external processing circuitry. In some embodiments, the first and second photoacoustic cells may be physically connected to each other such as by one or more printed circuit boards (not depicted), for example, to maintain a desired distance between first port 206 and second port 506. The processing circuitry (e.g., of substrate 210 and/or 510, or external processing circuitry) receives a first MEMS diaphragm 202 output signal (e.g., an omni-directional response) from MEMS diaphragm 202, including pressure wave and ambient noise components and receives a second MEMS diaphragm 502 output signal (e.g., an omni-directional response) from second MEMS diaphragm 502, including an ambient noise component. These outputs are processed (e.g., scaled and/or subtracted, or otherwise filtered) to determine a bi-directional response of the respective systems that isolates the pressure wave component received by MEMS diaphragm 202. In the embodiment of FIG. 5C, the first port 206 and second port 506 are located proximate to each other such that an ambient noise acoustic signal received by the respective photoacoustic cells should be substantially identical.

Figure 6:
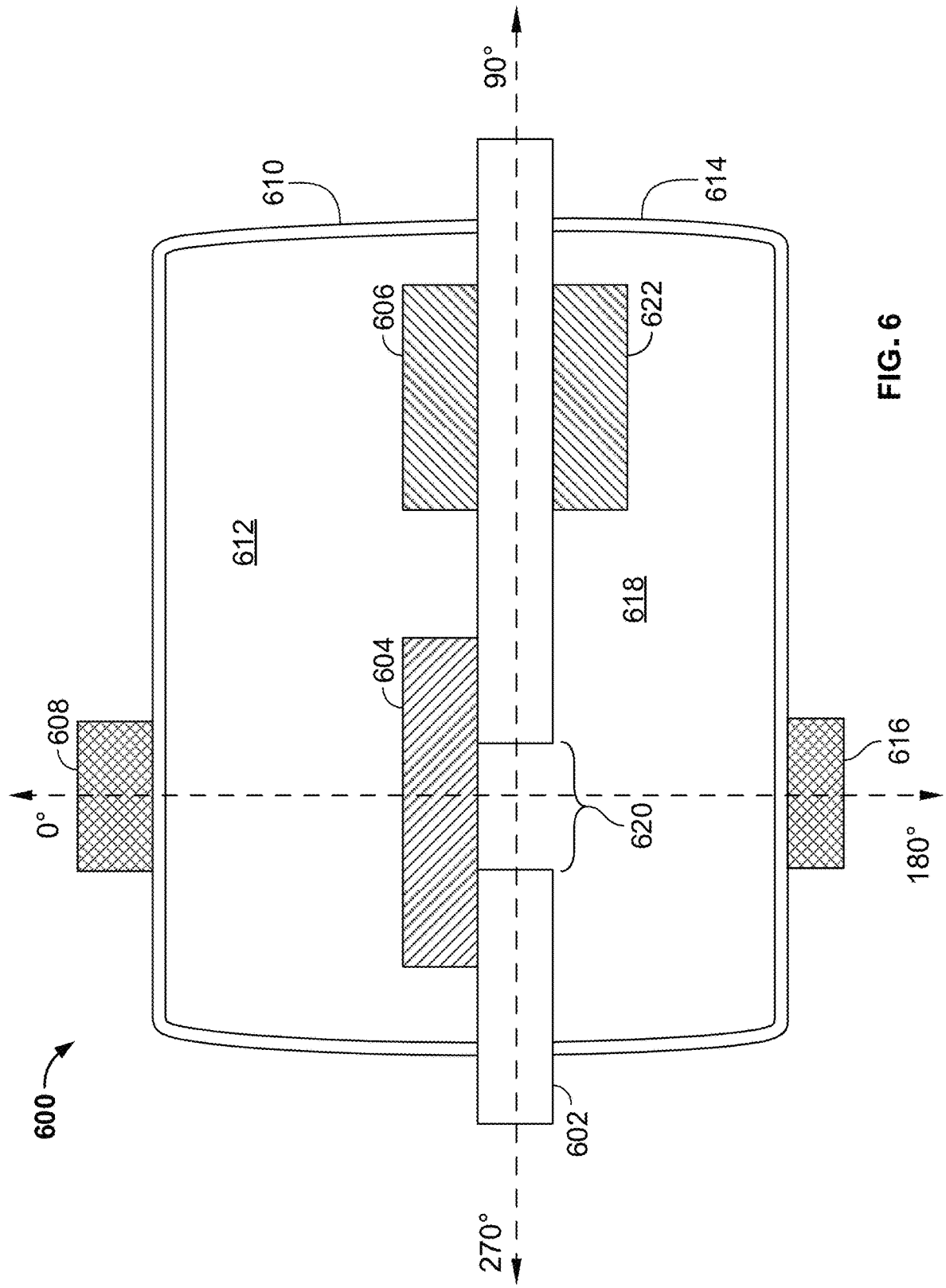
FIG. 6 shows an illustrative bi-directional gas sensing system with opposite photoacoustic cells including a shared MEMS diaphragm, in accordance with an embodiment of the present disclosure.

FIG. 6 shows an illustrative bi-directional gas sensing system with opposite photoacoustic cells including a shared MEMS diaphragm, in accordance with an embodiment of the present disclosure. In the depicted embodiment, system 600 includes substrate 602, MEMS diaphragm 604, electromagnetic radiation source 606, first port 608, first photoacoustic cell cover 610, and first interior volume 612. In addition, system 600 includes second photoacoustic cell cover 614, second port 616, second interior volume 618, gap 620, and dummy electromagnetic radiation source 622. Although particular components are depicted in certain configurations for system 600, it will be understood that components may be removed, modified, or substituted and that additional components (e.g., processing circuitry, ports, etc.) may be added in certain embodiments.

Substrate 602 is coupled to MEMS diaphragm 604 and electromagnetic radiation source 606. In addition, substrate 602 connects to the first photoacoustic cell cover 610 and second photoacoustic cell cover 614. It will be understood that substrate 602 may include processing circuitry (e.g., an ASIC, a FPGA, etc.) that receives and processes a MEMS diaphragm output signal to determine a bi-directional response of system 600, may provide signal paths to external processing circuitry, and/or that signal paths and processing circuitry may be external to substrate 602. Substrate 602 includes gap 620, which extends through substrate 602 and allows an acoustic signal to travel through second port 616 and access a second side of MEMS diaphragm 604 via interior volume 618 within second photoacoustic cell cover 614. In some embodiments, gap 620 may be a variety of sizes and shape to facilitate providing an ambient noise signal to the side of MEMS diaphragm 604 opposite interior volume 612.

MEMS diaphragm 604 (e.g., a gradient microphone) includes a first side located in first photoacoustic cell cover 610 and exposed to first interior volume 612 and a second side located in second photoacoustic cell cover 614 and exposed to second interior volume 618. In some embodiments, there may multiple MEMS diaphragms within system 600, some of which may be exposed to both interior volumes, and some of which are exposed to only one interior volume. Such a multi-diaphragm system may provide additional data for calibrating or fine tuning the output of system 600 to better capture the desired gas-induced pressure wave while rejecting ambient noise signals.

The first side of MEMS diaphragm 604, which is sensitive to ambient noise signals (e.g., far-field and diffuse-field ambient noise) and pressure waves (e.g., near-field acoustic signals) received via first port 608, is located opposite the second side of MEMS diaphragm 604. The first photoacoustic cell cover receives an external gas (e.g., carbon dioxide, water, carbon monoxide, methane, ammonia, nitrogen oxide, formaldehyde, ethanol, or acetone), via first port 608, from a gas source which reacts to radiation (e.g., near an infrared wavelength) emitted in a modular, pulsed manner (e.g., at a modulation frequency) by electromagnetic radiation source 606 to provide energy to the first side of MEMS diaphragm 604 in pulses. Electromagnetic radiation source 606 attaches to substrate 602 and, in some embodiments, may electrically couple to substrate 602 and/or external processing circuitry. The radiation emitted from electromagnetic radiation source 606 interacts with the external gas by heating up and cooling down its molecules, which generates pressure waves (e.g., acoustic signals) that are detected by the first side of MEMS diaphragm 604. Concurrently, the first side of MEMS diaphragm 604 picks up ambient noise signals (e.g., generated from computer fans, an HVAC system, lab equipment, etc.) from system 600's immediate, surrounding environment via port 608 and first interior volume 612. The first side of MEMS diaphragm 604 is fabricated as a relatively thin layer of material having a shape that collectively facilitates movement of the first side of MEMS diaphragm 604 in response to pressure waves and ambient noise signals. It will be understood that there may be any number of ports within system 600. In some embodiments, port 608 may incorporate acoustic filtering, such as low-pass filtering, by selection of filter acoustic resistance, port acoustic mass, or interior volume 612. It will be understood that the pressure waves, generated by external gas molecules interacting with emitted radiation within first photoacoustic cell cover 610, may pulse at an audio bandwidth (e.g., 20 Hz to 20 kHz). A Photoacoustic Gas Sensing Model, as described earlier in this disclosure, conveys the inverse relationships between the amplitude (e.g., intensity) of a pressure wave "$p(\omega)$" and radiation modulation frequency "$\omega$" as well as the amplitude (e.g., intensity) of a pressure wave "p(ω)" and first photoacoustic cell cover 610 volume "$V_{cell}$" respectively. Similarly, ambient noise amplitude and frequency share an inversely proportional relationship (e.g., 1/f—ambient noise amplitude increases as frequency decreases and ambient noise amplitude decreases as frequency increases).

The second side of MEMS diaphragm 604, which is sensitive to ambient noise signals (e.g., far-field and diffuse-field ambient noise) received via second port 616 and gap 620, is located opposite the first side of MEMS diaphragm 604. Dummy electromagnetic radiation source 622, which attaches to substrate 602 within second photoacoustic cell cover 614, doesn't emit radiation and, therefore, doesn't cause the generation of pressure waves as a result of emitted radiation interacting with external gas molecules received via port 616. Dummy electromagnetic radiation source 622 serves to match the characteristics of electromagnetic radiation source 606 in first photoacoustic cell cover 610, so second interior volume 618 of second photoacoustic cell cover 614 is the same or similar as first interior volume 612 of first photoacoustic cell cover 610, or otherwise scaled or configured to match the ambient noise propagation characteristics of the first interior volume 612 (e.g., by modifying sizes and/or shapes of components such that a reduced amplitude ambient noise signal received within interior volume 618 is amplified with respect to the ambient noise signal received via interior volume 612). Accordingly, the acoustic compliance of second photoacoustic cell cover 614 is similar to that of first photoacoustic cell cover 610. Dummy electromagnetic radiation source 622 is a suitable size to match the ambient noise propagation characteristics in the interior volume 612. In this manner, dummy electromagnetic radiation source 622 is be located within first photoacoustic cell cover 610, while electromagnetic radiation source 606 is be located within second photoacoustic cell cover 614 such that the second side of MEMS diaphragm 604 is sensitive to ambient noise signals and the first side of MEMS diaphragm 604 is sensitive to ambient noise signals and pressure waves. MEMS diaphragm 604 exhibits a bi-directional (e.g., gradient) response across the first and second sides of MEMS diaphragm 604, where MEMS diaphragm 604 responds to a difference in sound pressure (e.g., pressure waves) between the acoustic signals received on the two sides of MEMS diaphragm 604 to determine a bi-directional response (e.g., mechanically cancel ambient noise signals) that isolates the pressure wave component received by the first side of MEMS diaphragm 604. In some embodiments, the bi-directional response of system 600 may be due to an acoustic dipole (e.g., two point sources, one with an inverted response to the other, with a distance between them that corresponds to path lengths of respective sound waves) that provides a known scaling between respective received ambient noise signals at opposite sides of the MEMS diaphragm 604. MEMS diaphragm 604 delivers a MEMS diaphragm output signal (e.g., corresponding to the foregoing bi-directional response) to processing circuitry be processed and/or analyzed and, in some embodiments, delivered to an external component or system. In some embodiments, system 600 may operate in a noise-cancelling mode to allow for photoacoustic measuring and may still be used to analyze external acoustic signals, especially at higher frequencies.

First photoacoustic cell cover 610 attaches to substrate 602 to surround the first side of MEMS diaphragm 604 and electromagnetic radiation source 606. First photoacoustic cell cover 610, which is located opposite substrate 602 from second photoacoustic cell cover 614, protects internal components from external stressors or hazards (e.g., heat, light, particles, etc.) that may alter the functionality of system 600, and the size of first photoacoustic cell cover 610, which may be a variety of sizes, defines first interior volume 612. Second photoacoustic cell cover 614 attaches to substrate 602 to surround the second side of MEMS diaphragm 604 and the dummy electromagnetic radiation source 622. It will be understood that second photoacoustic cell cover 614 is located opposite substrate 602 from first photoacoustic cell cover 610. Second photoacoustic cell cover 614 protects internal components from external stressors or hazards (e.g., heat, light, particles, etc.) that may alter the functionality of system 600, and the size of second photoacoustic cell cover 614, which may be a variety of sizes, defines second interior volume 618. External gas molecules (e.g., carbon dioxide, water, carbon monoxide, methane, ammonia, nitrogen oxide, formaldehyde, ethanol, acetone, etc.) and ambient noise signals enter second photoacoustic cell cover 614 via second port 616, which attaches to second photoacoustic cell cover 614 to allow access to second interior volume 618. In some embodiments, second port 616 may incorporate acoustic filtering, such as low-pass filtering (e.g., to compensate for low-frequency acoustic signals with high noise amplitudes), by selection of filter acoustic resistance, port acoustic mass, or second interior volume 618. It will be understood that further electronic filtering may be used by second port 616.

In some embodiments, systems 500 or 600 may be used to cancel a variety of ambient acoustic signals of interest for the purpose of automating or interacting with the photoacoustic gas sensor, its data, or other connected systems such as speech-oriented systems (e.g., voice activity detection, commands, keywords, etc.), environmental systems (e.g., fire alarm, glass break, ultrasonic occupancy detectors, pipe burst, etc.), or real-time ambient acoustic noise sensing (e.g., frequency-domain analysis to determine optimal modulation frequency or time-domain analysis to determine optimal time window for data acquisition). In some embodiments, analysis of photoacoustic gas sensor data, received via acoustic signals, may be used for correlation, machine learning, or other processes. It will be understood that in addition to the foregoing embodiments to isolate pressure waves to improve the SNR of the photoacoustic gas sensors depicted by systems 500 and 600, a beam-forming process may be used to achieve directionality for external acoustic signals. In some embodiments, external acoustic signals may be used to determine optimal physical placement for minimal acoustic noise detection by feeding back to a user interface. For example, orienting the polar pattern null of the bi-directional MEMS diaphragm of system 600 towards a dominant, directional noise source may benefit the SNR of the photoacoustic gas sensor.

Figure 7:
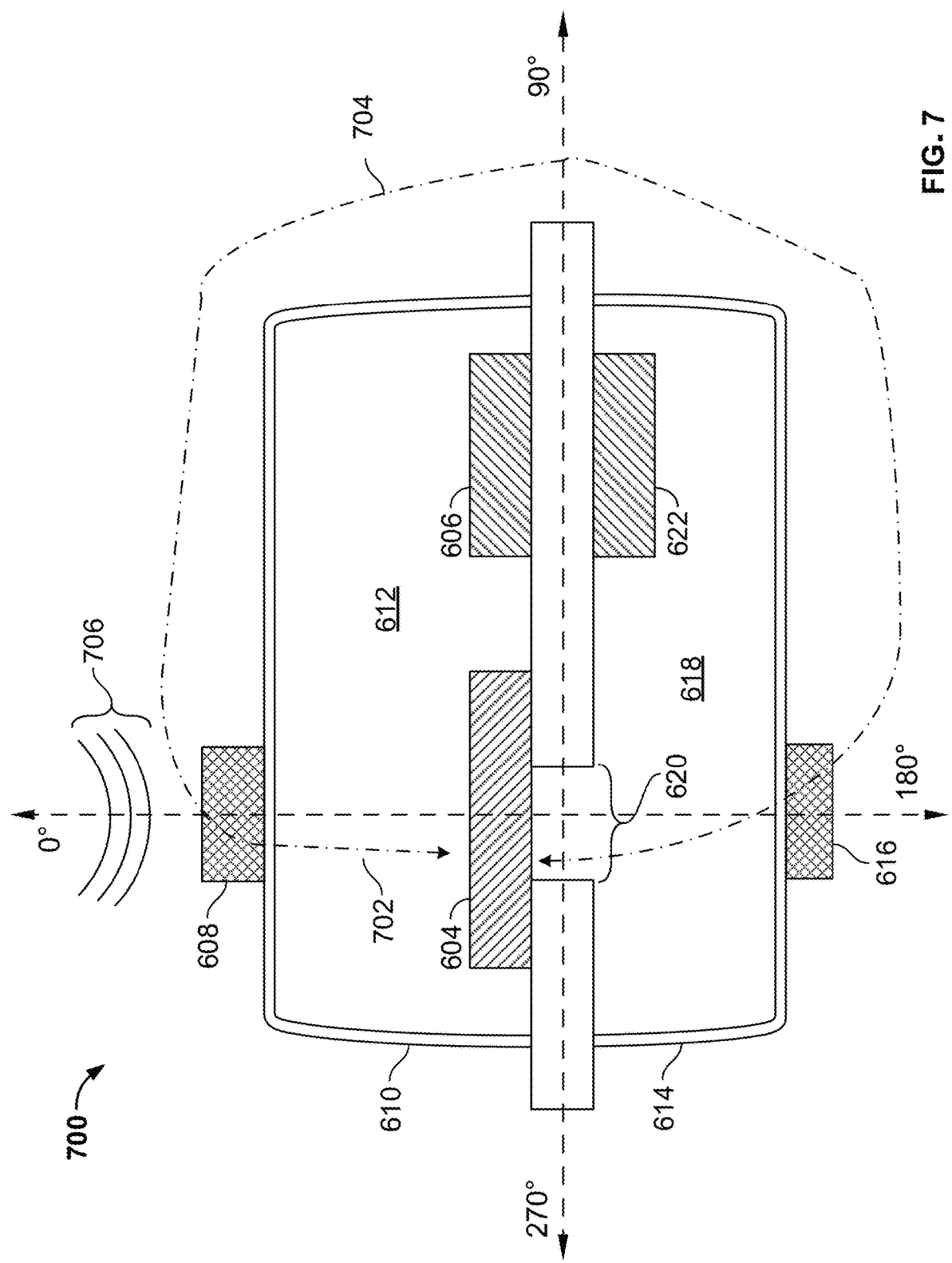
FIG. 7 shows an illustrative bi-directional gas sensing system, with opposite photoacoustic cells including a shared MEMS diaphragm and depicted acoustic signal paths, in accordance with an embodiment of the present disclosure.

FIG. 7 shows an illustrative bi-directional gas sensing system of FIG. 5, with opposite photoacoustic cells including a shared MEMS diaphragm and depicted acoustic signal paths, in accordance with an embodiment of the present disclosure. In addition to the components disclosed and discussed in FIG. 6, the depicted embodiment of system 700 includes first acoustic signal path 702, second acoustic signal path 704, and ambient noise acoustic signal 706. The relative paths of first acoustic signal path 702 and second acoustic signal path 704 are factors in determining how much acoustic signals with different frequencies are rejected. For example, certain relationships (e.g., distance, relative orientation, etc.) of the respective acoustic signal paths are good for rejection of far-field, low frequency acoustic noise and a physically small photoacoustic gas sensor, allowing a reduction in the internal cell volume "V ee n" to generate a larger photoacoustic signal output (e.g., improving the gas sensor's SNR) while canceling ambient noise.

In the embodiment of FIG. 7, an ambient noise acoustic signal 706 is located directly above port 608, such that a first acoustic signal path 702 extends directly through port 608 in the direction of a first side of MEMS diaphragm 604 exposed to interior volume 612. Second acoustic signal path 704 requires the ambient noise signal to ambient noise acoustic signal 706 to propagate around the system 700 (only one direction of propagation shown in FIG. 7, although it will be understood that the second acoustic path includes all possible paths in three directions from ambient noise acoustic signal 706 to second port 616) to access the opposite side of MEMS diaphragm 604 exposed to interior volume 618 via second port 616. The design, selection, and positioning of respective photoacoustic cells may be selected based on expected locations of ambient noise acoustic signals 706 and known available propagation paths of acoustic signal paths 702 and 704. For example, as depicted in FIGS. 6 and 7, it may be expected based on an end-use product design that ambient noise acoustic signal 706 will be received above port 608, or below port 616. In the embodiments of FIGS. 5A and 5C, an expected ambient noise acoustic signal source may be between first port 206 and second port 506, while in the embodiment of FIG. 5B an expected ambient noise acoustic signal source may be above first port 206 and below second port 506. As described below, such designs may provide for cancellation by the MEMS diaphragms if the noise source is at the expected locations, while other locations of noise sources may be self-cancelling based on the propagation of the acoustic energy.

Figure 8:
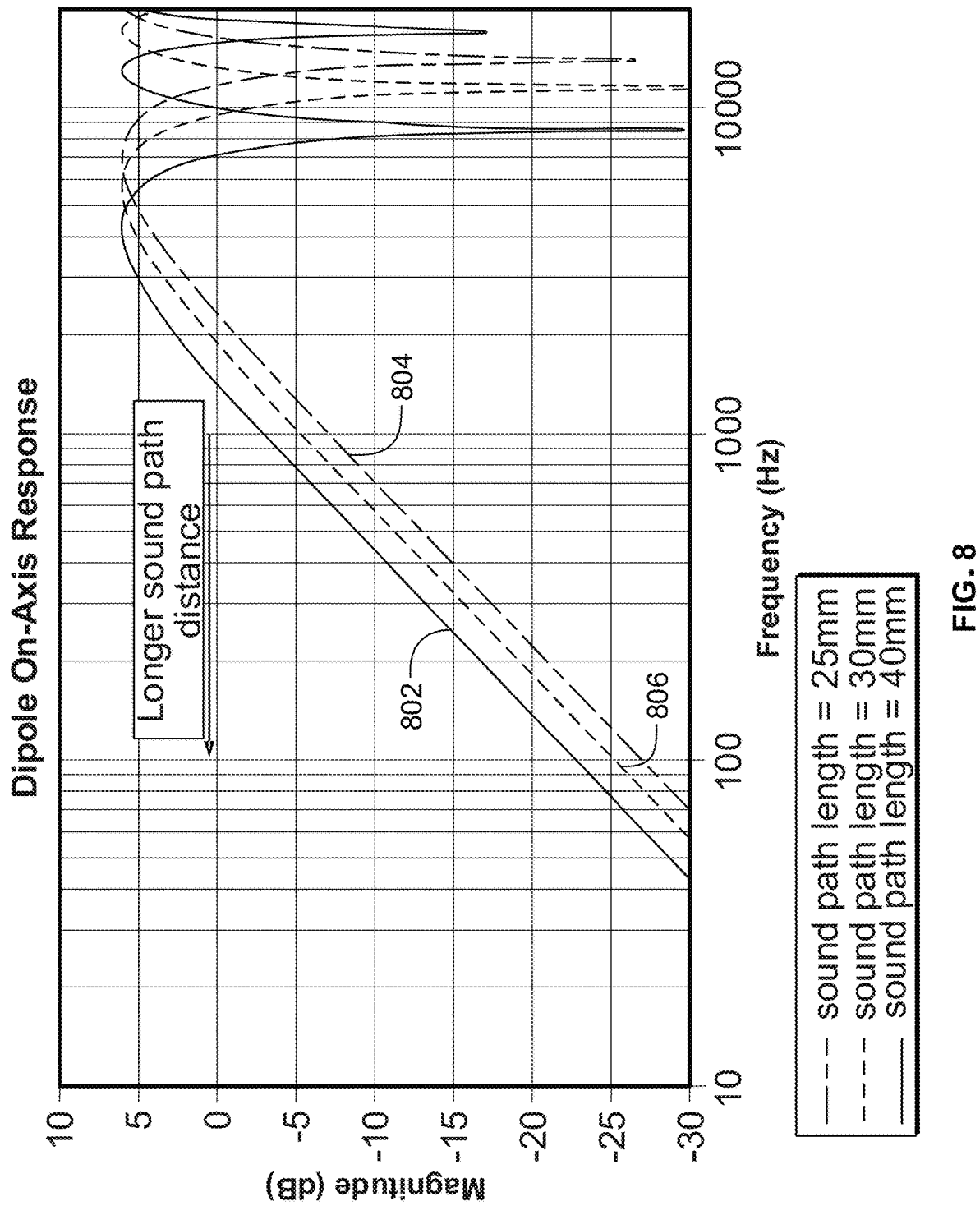
FIG. 8 shows an example diagram depicting a dipole on-axis response by a bi-directional gas sensing system with opposite photoacoustic cells, in accordance with an embodiment of the present disclosure.

FIG. 8 shows an example diagram depicting a dipole on-axis response by a bi-directional gas sensing system with opposite photoacoustic cells, in accordance with an embodiment of the present disclosure. FIG. 8 displays a far-field dipole on-axis response (e.g., located +/−180 degrees from two acoustic signal sources) of system 700, where the sensitivity of the bi-directional MEMS diaphragm, depicted in FIG. 7, decreases at 6 decibels per octave due to its gradient response (e.g., to a difference in sound pressure) between the first and second acoustic signals received by the first and second sides of the MEMS diaphragm. FIG. 8 includes the on-axis response of the bi-directional MEMS diaphragm at various acoustic signal path lengths (e.g., 25 mm, 30 mm, and 40 mm). It will be understood that the bi-directional MEMS diaphragm's on-axis response is not limited to the acoustic sound path lengths provided by FIG. 8. Acoustic sound path 804 has a length of 25 mm and appears to be rejected below approximately 70 Hz, where the MEMS diaphragm's on-axis response begins decreasing at approximately 7 kHz, acoustic sound path 806 has a length of 30 mm and appears to be rejected at approximately 60 Hz, where the MEMS diaphragm's on-axis response begins decreasing at approximately 6 kHz, and acoustic sound path 802 has a length of 40 mm and appears to be rejected at approximately 45 Hz, where the MEMS diaphragm's on-axis response begins decreasing at approximately 4 kHz. In this manner, a longer the acoustic sound path length corresponds to lower frequencies of noise rejection.

Figure 9B:
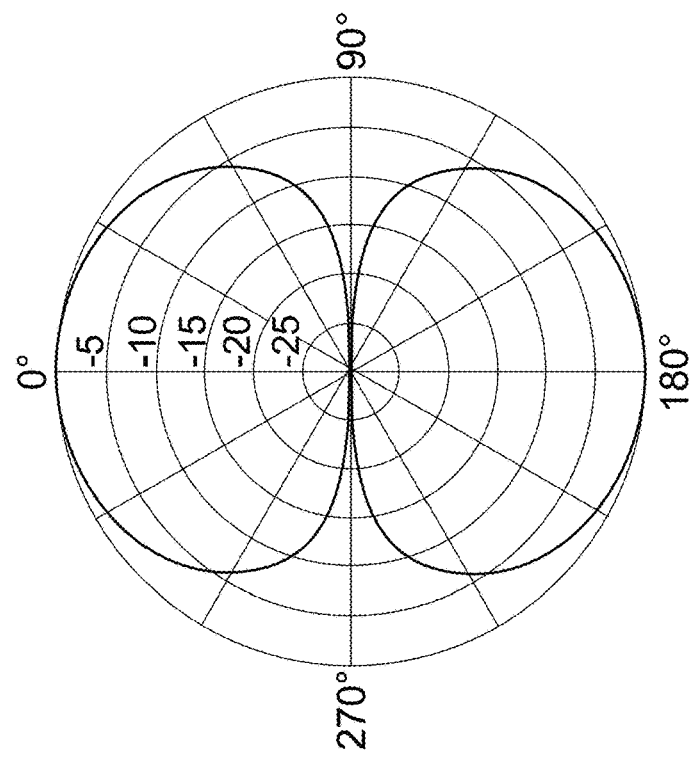
FIG. 9B shows an illustrative dipole polar response of FIG. 9A, in accordance with an embodiment of the present disclosure.
Figure 9A:
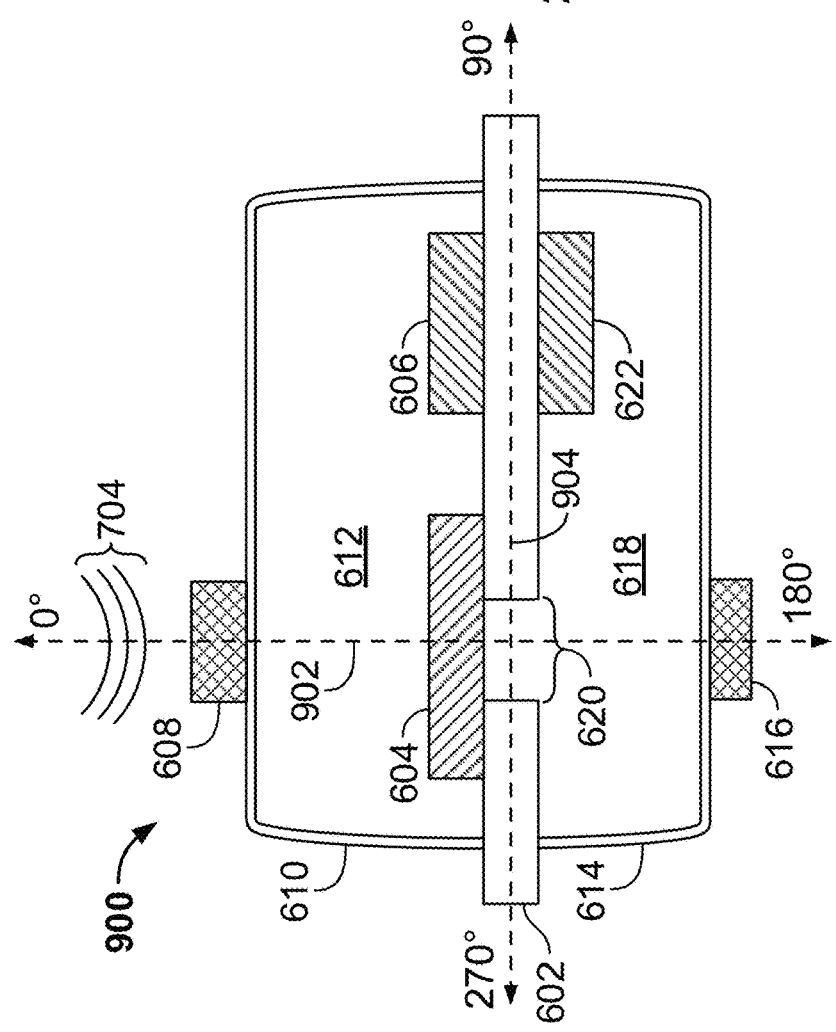
FIG. 9A shows an illustrative bi-directional gas sensing system, with opposite photoacoustic cells comprising one MEMS diaphragm, including polar coordinates, in accordance with an embodiment of the present disclosure.

FIG. 9A shows an illustrative bi-directional gas sensing system of FIGS. 6 and 7, with opposite photoacoustic cells comprising one MEMS diaphragm, including polar coordinates, in accordance with an embodiment of the present disclosure, while FIG. 9B shows an illustrative dipole polar response of FIG. 9A, in accordance with an embodiment of the present disclosure. FIG. 9B depicts the bi-directional polar detection pattern from an acoustic dipole (e.g., two point sources, one with an inverted response to the other, with a distance between them that corresponds to path lengths of respective sound waves), which shows a "figure 8" shape with strong nulls at +/−90 degrees from two acoustic signal sources (e.g., located at 0 degrees and 180 degrees). It will be understood that the strong nulls reject sound detection at all frequencies. Accordingly, if a noise source is oriented at 90 degrees or 270 degrees, none or very little of the ambient noise signal will be communicated through the ports 608 and 616. If a noise source is oriented at 0 degrees or 180 degrees with respect to the system, the ambient noise signal will have a similar amplitude at both sides of the MEMS diaphragm 604. Accordingly, the present system may effectively cancel and/or not be exposed to ambient noise at any noise source orientation. A similar response will be applied to other embodiments, such as those of FIGS. 5A-5C, based on their respective locations. As long as the primary photoacoustic cell and dummy photoacoustic cell are positioned appropriately to receive similar (or predictably scaled) ambient noise signals at most ambient noise source orientations, or receive only reduced ambient noise signals at other orientations, the ambient noise signal may be consistently rejected. Compared to an omni-directional response (e.g., without a dummy photoacoustic cell), the bi-directional response of system 900 may on average have a 4.8 decibel lower response to diffuse-field ambient noise, otherwise known as a directivity index (e.g., the difference in sound pressure between the measured sound pressure level in a given direction from the real source and the average sound pressure level from an omni-directional source). This allows operation of the electromagnetic radiation source at significantly lower frequencies in which the gas response is optimal.

In some embodiments, the acoustic noise signals sensed by the MEMS diaphragm(s) may be used for product development, component placement, and/or field calibration. When the electromagnetic radiation source is not emitting a signal to cause a pressure wave to potentially be induced in a gas of interest, the primary contributor to movement of the MEMS diaphragm may be the external noise source. When an external noise source is known to be operational, the respective signals that are output from the MEMS diaphragm(s) at different orientations with respect to the noise source may be used to understand and/or modify the relative location or orientation of the PAGS sensor with respect to the external noise source, based on a particular desired end-use application (e.g., to optimize noise cancellation and/or to be able to monitor the external acoustic noise signal while the electromagnetic radiation source is not active). The respective signals may also be used to determine a pulse frequency for the electromagnetic radiation source to avoid overlap with external noise frequencies.

Figure 10:
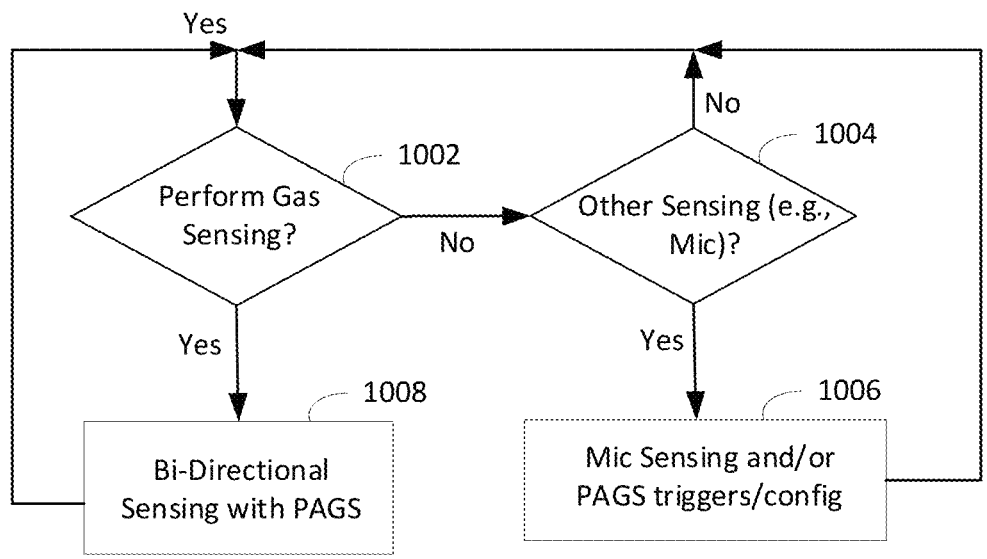
FIG. 10 shows illustrative steps of performing bidirectional sensing with a PAGS including at least one MEMS diaphragm, in accordance with an embodiment of the present disclosure.

FIG. 10 shows illustrative steps of performing bidirectional sensing with a PAGS including at least one MEMS diaphragm, in accordance with an embodiment of the present disclosure. Although a particular set of steps is depicted in a particular sequence in FIG. 10, it will be understood that one or more steps may be added or omitted and that the sequences of steps may be modified. Although the steps of FIG. 10 may be described within the context of the PAGS sensors depicted and described herein, it will be understood that the present steps apply to other types of PAGS sensors that experience external noise such as through an access port, and to other MEMS diaphragm (e.g., microphone) designs and configurations as well as other photoacoustic cell designs and configurations.

At step 1002, it may be determined whether to perform sensing for the gas concentration using the PAGS. For example, sensing may only be performed at certain times based on triggering actions such as when an external acoustic noise signal is below a certain threshold at relevant frequencies of interest for gas sensing. As another example, the PAGS sensors described herein may be operated in a microphone mode (e.g., without active operation of the electromagnetic radiation source) to intentionally acquire and monitor the external acoustic noise signal (e.g., which in some embodiments may also be a signal of interest, such as for voice detection, keyword detection, command detection, or environmental detection such as a fire alarm, glass breaking, ultrasonic occupancy detectors, pipe burst, etc.). If gas sensing is not to be performed, processing may continue to step 1004. If gas sensing is to be performed, processing may continue to step 1008.

At step 1004, it may be determined whether other sensing is to be performed. As described herein, the MEMS diaphragm(s) of the PAGS sensors may be utilized to perform other sensing, such as by utilizing the MEMS diaphragm(s) as MEMS microphones. In an embodiment of a single MEMS diaphragm receiving signals on both sides, the MEMS diaphragm normally cancels noise but may operate as an omni-directional MEMS microphone to some degrees at frequencies higher than a typical pulsing frequency of the electromagnetic radiation source. In an embodiment of multiple MEMS diaphragms, instead of cancelling the diaphragm output signals (or in some embodiments, in addition to cancelling the diaphragm output signals), the MEMS diaphragm output signals may be analyzed in a manner similar to conventional MEMS diaphragms. If other sensing is to be performed, processing may continue to step 1006. If other processing is not to be performed, processing may return to step 1002.

At step 1006, the other sensing may be performed, such as speech or environmental monitoring, real-time ambient noise signaling, or performing acoustic beam forming (e.g., using both mic signals in a beam-forming processing in order to achieve directionality for external acoustic signals). Speech patterns (e.g., voice activity, commands, keywords, etc.) or environmental noise (e.g., fire alarm, glass break, ultrasonic occupancy detectors, pipe burst, etc.) may be analyzed independently to obtain the underlying speech or sound signal and/or as a trigger to initiate gas sensing (e.g., upon return to step 1002), or to set parameters such as pulse frequency for gas sensing at step 1008. Once the other sensing is performed, processing may return to step 1002.

At step 1008, gas sensing may be performed as described herein. In some embodiments, the timing and/or signal parameters (e.g., frequency, wavelength, etc.) of the gas sensing may be based on information provided by processing circuitry, including based on the MEMS diaphragms of the gas sensors operating as microphones. For example, a sensor may receive a command to sense a particular gas, and may sense a significant noise source at a particular frequency. Thus, the wavelength and pulse pattern may be modified based on this information to correspond to the selected gas and avoid directly overlapping the frequency range of the noise source. Once gas sensing has been performed, the processing may return to step 1002.

The foregoing description includes exemplary embodiments in accordance with the present disclosure. These examples are provided for purposes of illustration only and not for purpose of limitation. It will be understood that the embodiments are exemplary only, and that aspects of different embodiments may be combined in a variety of manners in accordance with the present disclosure. It will be understood that the present disclosure may be implemented in forms different from those explicitly described and depicted herein and that various modifications, optimizations, and variations may be implemented by a person of ordinary skill in the present art, consistent with the following claims.

What is claimed is:

1. A system for improving signal-to-noise ratio in a photoacoustic gas sensor, comprising:
   a first MEMS diaphragm;
   an electromagnetic radiation source configured to generate a photoacoustic signal from a gas of interest;
   a first photoacoustic cell defining a first volume, wherein the first MEMS diaphragm and the electromagnetic radiation source are located within the first volume, and wherein the first photoacoustic cell includes a first port configured to receive an external gas in the first volume;
   a first acoustic signal path, via the first port, to the first MEMS diaphragm;
   a second MEMS diaphragm;
   a second photoacoustic cell defining a second volume, wherein the second MEMS diaphragm is located within the second volume, wherein the second photoacoustic cell includes a second port to expose the second volume to an external environment;
   a second acoustic signal path, via the at least one port of the at least one photoacoustic cell, to the second MEMS diaphragm, wherein the first MEMS diaphragm receives a far-field acoustic noise signal via the first acoustic signal path and the first port and the second MEMS diaphragm receives the far-field acoustic noise signal via the second acoustic signal path, and wherein the first port and the second port are oriented at 180 degrees such that the first MEMS diaphragm has a first sensitivity to a far-field acoustic noise signal and the second MEMS diaphragm has a second sensitivity to the far-field acoustic noise signal; and
   processing circuitry configured to:
      receive a first signal from the first MEMS diaphragm based on the photoacoustic signal and the received far-field acoustic noise signal;
      receive a second signal from the second MEMS diaphragm based on the received far-field acoustic noise signal;
      scale the second signal based on the first sensitivity and the second sensitivity; and
      determine a bi-directional response based on the first signal and the scaled second signal, wherein noise of an output signal corresponding to a concentration of a gas of interest is reduced based on the bi-directional response.

2. The system of claim 1, wherein the electromagnetic radiation source is located within the first photoacoustic cell, wherein a first interior volume of the first photoacoustic cell is based on the electromagnetic radiation source and the first MEMS diaphragm, and wherein the second photoacoustic cell comprises a second interior volume having a similar acoustic compliance as the first interior volume.

3. The system of claim 2, further comprising a dummy electromagnetic radiation source located within the second photoacoustic cell, wherein the dummy electromagnetic radiation source has a similar shape to the electromagnetic radiation source.

4. The system of claim 3, wherein the first photoacoustic cell is stacked over the second photoacoustic cell such that the first port and the second port are located 180 degrees from each other and open in an opposite direction from each other.

5. The system of claim 4, wherein a location of each of the first port, the electromagnetic radiation source, and the first MEMS diaphragm of the first photoacoustic cell is symmetric with a respective second port, dummy electromagnetic radiation source, and second MEMS diaphragm of the second photoacoustic cell.

6. The system of claim 4, wherein a far-field on-axis acoustic sensitivity of the first MEMS diaphragm and the second MEMS diaphragm decreases at 6 decibels per octave due to a gradient response to the first acoustic signal path and the second acoustic signal path.

7. The system of claim 6, wherein the far-field on-axis responses are zero degrees and 180 degrees from the external acoustic source.

8. The system of claim 4, wherein the first MEMS diaphragm and the second MEMS diaphragm exhibit pressure wave nulls at +/−90 degrees of the first port from the external acoustic source.

9. The system of claim 4, wherein the bi-directional response of the first MEMS diaphragm and the second MEMS diaphragm is based on an acoustic dipole corresponding to a relative location with respect to the external acoustic source.

10. The system of claim 1, wherein the first MEMS diaphragm is sensitive to the far-field acoustic noise and gas pressure waves, and wherein the second MEMS diaphragm is sensitive to the far-field acoustic noise.

11. The system of claim 1, wherein the first and the second port each incorporate acoustic filtering, and wherein the acoustic filtering comprises at least one of filter acoustic resistance or a port acoustic mass.

12. The system of claim 1, wherein the processing circuitry is configured to receive a first MEMS diaphragm output signal from the first MEMS diaphragm, receive a second MEMS diaphragm output signal from the second MEMS diaphragm, and determine the bi-directional response based on a comparison of the first MEMS diaphragm output signal and the second MEMS diaphragm output signal.

13. The system of claim 1, wherein a far-field on-axis acoustic sensitivity of the at least one MEMS diaphragm decreases at 6 decibels per octave due to a gradient response to the first acoustic signal path and the second acoustic signal path.

14. The system of claim 13, wherein the far-field on-axis responses are 0 degrees and 180 degrees from the external acoustic source.

15. The system of claim 1, wherein the at least one MEMS diaphragm exhibits pressure wave nulls at +/−90 degrees of the at least one port from the external acoustic source.

16. The system of claim 1, wherein the bi-directional response of the one MEMS diaphragm is based on an acoustic dipole corresponding to a relative location with respect to an external acoustic source.

17. The system of claim 1, wherein the external gas is carbon dioxide, water, carbon monoxide, methane, ammonia, nitrogen oxide, formaldehyde, ethanol, or acetone.

18. The system of claim 1, wherein a frequency of a signal pattern emitted by electromagnetic radiation interacting with the external gas is in a frequency range of interest, and wherein the determined bi-directional response substantially eliminates noise within the frequency range of interest.

19. The system of claim 1, wherein the first at least one MEMS diaphragm receives an external acoustic source during a period of time while the electromagnetic radiation source is inactive, and wherein the processing circuitry is configured to generate a microphone signal based on the one or more signals from the at least one MEMS diaphragm.

20. The system of claim 19, wherein the microphone signal corresponds to a voice command, and wherein the determination of the bi-directional response is based on the voice command.

21. The system of claim 19, wherein the microphone signal corresponds to an environmental signal, and wherein the determination of the bi-directional response is based on the environmental signal.

* * * * *

UNITED STATES PATENT AND TRADEMARK OFFICE
CERTIFICATE OF CORRECTION

PATENT NO. : 12,287,280 B2
APPLICATION NO. : 17/890016
DATED : April 29, 2025
INVENTOR(S) : Jeremy Parker et al.

Page 1 of 1

It is certified that error appears in the above-identified patent and that said Letters Patent is hereby corrected as shown below:

In the Claims

In Column 22, Claim 19, Line 28, delete "first at least one" and insert -- first --, therefor.

Signed and Sealed this
Third Day of June, 2025

Coke Morgan Stewart
*Acting Director of the United States Patent and Trademark Office*